United States Patent
Kwon et al.

(10) Patent No.: US 12,380,936 B2
(45) Date of Patent: Aug. 5, 2025

(54) SIGNAL TRANSMISSION CIRCUIT AND MEMORY DEVICE INCLUDING THE SAME

(71) Applicant: SK hynix Inc., Gyeonggi-do (KR)

(72) Inventors: Chan Keun Kwon, Gyeonggi-do (KR); Se Jin Kang, Gyeonggi-do (KR); In Seok Kong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 169 days.

(21) Appl. No.: 18/458,165

(22) Filed: Aug. 30, 2023

(65) Prior Publication Data
US 2024/0347086 A1  Oct. 17, 2024

(30) Foreign Application Priority Data
Apr. 17, 2023 (KR) .......................... 10-2023-0050025

(51) Int. Cl.
*G11C 8/00* (2006.01)
*G11C 7/10* (2006.01)
*G11C 7/22* (2006.01)

(52) U.S. Cl.
CPC ............ *G11C 7/222* (2013.01); *G11C 7/1066* (2013.01); *G11C 7/1069* (2013.01); *G11C 7/1096* (2013.01)

(58) Field of Classification Search
CPC ..................................................... G11C 7/222
See application file for complete search history.

(56) References Cited

U.S. PATENT DOCUMENTS

| 6,720,807 B1 * | 4/2004 | Kubo ........................ G06F 1/10 327/161 |
| 9,183,900 B2 | 11/2015 | Lee |
| 2017/0140808 A1 * | 5/2017 | Jung ................... G11C 11/4093 |

FOREIGN PATENT DOCUMENTS

KR  10-2018-0056971 A  5/2018

* cited by examiner

*Primary Examiner* — Hoai V Ho
(74) *Attorney, Agent, or Firm* — IP & T GROUP LLP

(57) ABSTRACT

A signal transmission circuit comprising: a first data transmission circuit configured to output, through a first data output node thereof and in response to a first operation clock applied to a first clock input node thereof, first output data obtained by sensing and amplifying a first input data pair applied to a first differential input node pair thereof, a clock transmission circuit configured to output through a second data output node thereof, a second operation clock generated in response to the first operation clock applied to a second clock input node thereof while a power supply voltage and a ground voltage are applied to a second differential input node pair thereof, and a first data output circuit configured to output the first output data in synchronization with the second operation clock, wherein the first data transmission circuit is modeled on the clock transmission circuit.

19 Claims, 12 Drawing Sheets

SIGNAL TRANSMISSION CIRCUIT AND MEMORY DEVICE INCLUDING THE SAME

CROSS-REFERENCE TO RELATED APPLICATION

This application claims priority under 35 U.S.C. § 119 to Korean Patent Application No. 10-2023-0050025 filed on Apr. 17, 2023, which is incorporated herein by reference in its entirety.

BACKGROUND

1. Field

Various embodiments of the present disclosure relate to a semiconductor design, and particularly, to a signal transmission circuit capable of effectively transmitting signals and a semiconductor memory device including the same.

2. Discussion of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

On the other hand, inside the memory device, a data signal and a clock signal may be transmitted through a data transmission path and a clock transmission path. For example, after data is read from an internal cell memory area in response to a read clock, a read clock and read data may be outputted to the outside of the memory device through the data transmission path and the clock transmission path. For another example, after write data is inputted from the outside of the memory device in response to a write clock, the write clock and the write data may be transmitted to and stored in the cell memory area through the clock transmission path and the data transmission path.

Therefore, it is the most preferable that the data signal and the clock signal are transmitted inside the memory device through the clock transmission path and the data transmission path in synchronization with each other. However, the data signal and the clock signal may not be synchronized with each other according to PVT (process, voltage, temperature) variations.

SUMMARY

Various embodiments of the present disclosure are directed to providing a signal transmission circuit capable of effectively transmitting signals by minimizing an influence due to PVT (process, voltage, temperature) variations, and a semiconductor memory device including the same.

Technical problems to be resolved in the present disclosure are not limited to the aforementioned technical problems and other unmentioned technical problems will be clearly understood by those skilled in the art from the following description.

An aspect of an embodiment of the present disclosure includes a signal transmission circuit which may include: a first data transmission circuit configured to output, through a first data output node thereof and in response to a first operation clock applied to a first clock input node thereof, first output data obtained by sensing and amplifying a first input data pair applied to a first differential input node pair thereof; a clock transmission circuit configured to output through a second data output node thereof, a second operation clock generated in response to the first operation clock applied to a second clock input node thereof while a power supply voltage and a ground voltage are applied to a second differential input node pair thereof; and a first data output circuit configured to output the first output data in synchronization with the second operation clock. The first data transmission circuit may be modeled on the clock transmission circuit.

An aspect of an embodiment of the present disclosure includes a memory device which may include: a first memory area configured to internally read a first read data pair in response to a first read clock; a second memory area configured to internally read a second read data pair in response to a second read clock; a first data transmission circuit configured to output, through a first data line among first lines and in response to the first read clock, first output data obtained by sensing and amplifying the first read data pair applied to a first internal differential data input node pair thereof; a first clock transmission circuit configured to output through a clock line among the first lines, a third read clock generated in response to the first read clock while a power supply voltage and a ground voltage are applied to a second internal differential data input node pair; a second data transmission circuit configured to output, through a first data line among second lines and in response to the second read clock, second output data obtained by sensing and amplifying the second read data pair applied to a third internal differential data input node pair; a second clock transmission circuit configured to output through a clock line among the second lines, a fourth read clock generated in response to the second read clock while the power supply voltage and the ground voltage are applied to a fourth internal differential data input node pair; and a data output circuit connected to the first lines, the second lines, and shared lines, and configured to output through a first data line among the shared lines, one of the first output data in synchronization with the third read clock and the second output data in synchronization with the fourth read clock. The first data transmission circuit may be modeled on the first clock transmission circuit, and the second data transmission circuit may be modeled on the second clock transmission circuit.

An aspect of an embodiment of the present disclosure includes a memory device which may include: a first data transmission circuit configured to sense and amplify a first write data pair applied to a first internal differential data input node pair in response to a first write clock to output the amplified data as first storage data; a clock transmission circuit configured to output a second write clock generated in response to the first write clock while a power supply voltage and a ground voltage are applied to a second internal differential data input node pair; and a data storage operation circuit configured to store, in an internal memory area, the first storage data in synchronization with the second write clock. The first data transmission circuit may be modeled on the clock transmission circuit.

In the present technology, a circuit modeling a sensing and amplifying circuit used to sense and amplify data transmitted through a data transmission path may be used to transmit a clock through a clock transmission path.

Through this, a data signal and a clock signal may be transmitted while minimizing an influence due to PVT (process, voltage, temperature) variations.

DETAILED DESCRIPTION

Figure 1:
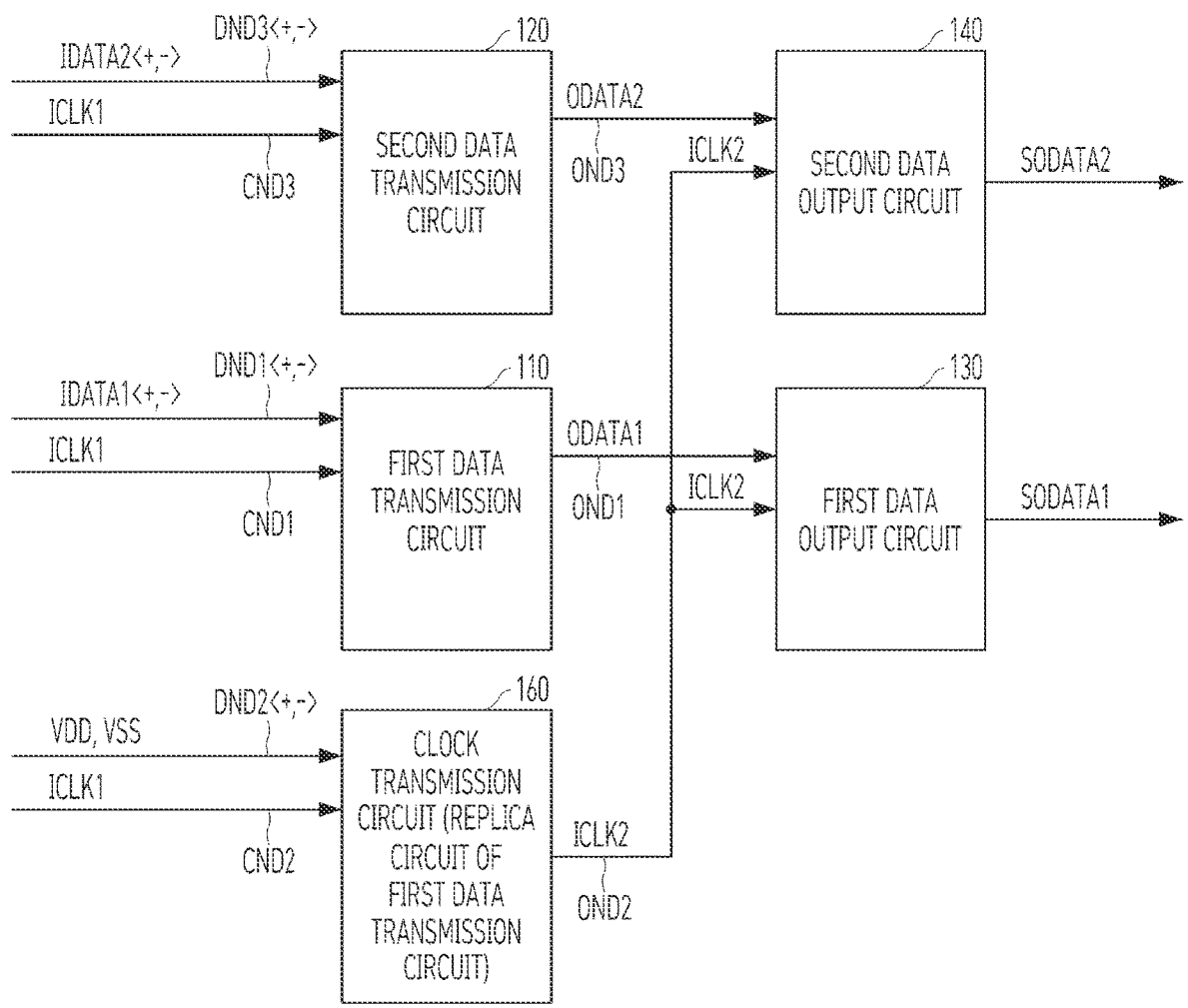
FIG. 1 is a diagram for describing an example of a signal transmission circuit for transmitting input data and an operation clock according to a first embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory (ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination.

That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIRST EMBODIMENT

FIG. 1 is a diagram for describing an example of a signal transmission circuit for transmitting input data and an operation clock according to a first embodiment of the present disclosure.

Referring to FIG. 1, the signal transmission circuit may include a first data transmission circuit 110, a second data transmission circuit 120, a clock transmission circuit 160, a first data output circuit 130, and a second data output circuit 140.

The first data transmission circuit 110 may output, through a first data output node OND1, first output data ODATA1 obtained by sensing and amplifying a first input data pair IDATA1<+,−> applied to a first differential input node pair DND1<+,−> in response to a first operation clock ICLK1 applied to a first clock input node CND1.

The clock transmission circuit 160, on which the first data transmission circuit 110 is modeled, may output, through a second data output node OND2, a second operation clock ICLK2 generated in response to the first operation clock ICLK1 applied to a second clock input node CND2 while a power supply voltage VDD and a ground voltage VSS are applied to a second differential input node pair DND2<+,−>. In such a case, the fact that the power supply voltage VDD and the ground voltage VSS are applied respectively to the positive and negative input nodes <+,−> of the second differential input node pair DND2<+,−> may mean that the power supply voltage VDD is applied to a positive input node <+> of the second differential input node pair DND2<+,−> and the ground voltage VSS is applied to a negative input node <−> thereof. In contrast, the fact that the power supply voltage VDD and the ground voltage VSS are applied respectively to the negative and positive nodes <−,+> of the second differential input node pair DND2<+,−> may mean that the ground voltage VSS is applied to the positive input node <+> of the second differential input node pair DND2<+,−> and the power supply voltage VDD is applied to the negative input node <−> thereof.

The first data output circuit 130 may output the first output data ODATA1 in synchronization with the second operation clock ICLK2.

The fact that the first data transmission circuit 110 is modeled on the clock transmission circuit 160 may mean that the circuit configuration included in the first data transmission circuit 110 has been almost identically replicated and applied to the internal circuit configuration of the internal clock transmission circuit 160.

In this way, since the first data transmission circuit 110 is modeled on the clock transmission circuit 160, an influence due to PVT (process, voltage, temperature) variations may be identically applied to the clock transmission circuit 160 and the first data transmission circuit 110. For example, the amount of delay, which varies by the PVT variations in the process in which the first input data pair IDATA1<+,−> is inputted to the first data transmission circuit 110 in response to the first operation clock ICLK1 and then is outputted as the first output data ODATA1, may be identical to the amount of delay varying by the PVT variations in the process in which the first operation clock ICLK1 is outputted from the clock transmission circuit 160 as the second operation clock ICLK2. Accordingly, it is possible to maximally secure a margin window meaning a range in which the value of the first output data ODATA1 may be accurately recognized based on the toggling of the second operation clock ICLK2. That is, when the first data output circuit 130 outputs the first output data ODATA1 in synchronization with the second operation clock ICLK2, the probability that the value of the first output data ODATA1 is accurately recognized may be greatly increased.

The second data transmission circuit 120 may output, through a third data output node OND3, second output data ODATA2 obtained by sensing and amplifying a second input data pair IDATA2<+,−> applied to a third differential input node pair DND3<+,−>, in response to the first operation clock ICLK1 applied to a third clock input node CND3.

The second data output circuit 140 may output the second output data ODATA2 in synchronization with the second operation clock ICLK2.

In such a case, the time point when the first input data pair IDATA1<+,−> is applied to the first data transmission circuit 110 may be identical to the time point when the second input data pair IDATA2<+,−> is applied to the second data transmission circuit 120. That is, the first input data pair IDATA1<+,−> and the second input data pair IDATA2<+,−> may be applied in parallel to the first data transmission circuit 110 and the second data transmission circuit 120.

In this way, the first data transmission circuit 110 and the second data transmission circuit 120 may sense and amplify different data inputted in parallel at the same time point and output the amplified data in parallel. That is, the first data transmission circuit 110 and the second data transmission circuit 120 may receive, sense, and amplify the first input data pair IDATA1<+,−> and the second input data pair IDATA2<+,−> inputted in parallel at the same time point, and output the first output data ODATA1 and the second output data ODATA2 in parallel.

Accordingly, an influence due to PVT variations may be identically applied to the first data transmission circuit 110 and the second data transmission circuit 120. For example, the amount of delay, which varies by the PVT variations in the process in which the first input data pair IDATA1<+,−> is inputted to the first data transmission circuit 110 in response to the first operation clock ICLK1 and then is outputted as the first output data ODATA1, may be identical to the amount of delay varying by the PVT variations in the process in which the second input data pair IDATA2<+,−> is inputted to the second data transmission circuit 120 in response to the first operation clock ICLK1 and then is outputted as the second output data ODATA2.

As described above, since an influence due to PVT variations may be identically applied to the clock transmission circuit 160 and the first data transmission circuit 110 and may be identically applied to the first data transmission circuit 110 and the second data transmission circuit 120, the influence due to PVT variations may also be identically applied to the clock transmission circuit 160 and the second data transmission circuit 120. Accordingly, it is possible to maximally secure a margin window meaning a range in which the value of the second output data ODATA2 may be accurately recognized based on the toggling of the second operation clock ICLK2. That is, when the second data output circuit 140 outputs the second output data ODATA2 in synchronization with the second operation clock ICLK2, the probability that the value of the second output data ODATA2 is accurately recognized may be greatly increased.

FIG. 1 discloses a configuration in which only the first data transmission circuit 110 and the second data transmission circuit 120 are provided to receive two input data IDATA1<+,-> and IDATA2<+,-> and transmit two output data ODATA1 and ODATA2 and only one clock transmission circuit 160 is provided to transmit one first operation clock ICLK1 as one second operation clock ICLK2. This is only one example, and in order to transmit more input data as output data, only one clock transmission circuit may be provided together with a larger number of data transmission circuits to transmit one first operation clock as one second operation clock. That is, even when a larger number of data and one clock are transmitted, the signal transmission circuit according to the first embodiment of the present disclosure may be applied. For example, it is also possible to perform an operation in which, through sixteen data transmission circuits for transmitting sixteen input data as sixteen output data and a clock transmission circuit, on which one of the sixteen data transmission circuits is modeled, a first operation clock applied to respective clock input nodes of the sixteen data transmission circuits is transmitted as a second operation clock.

Figure 2:
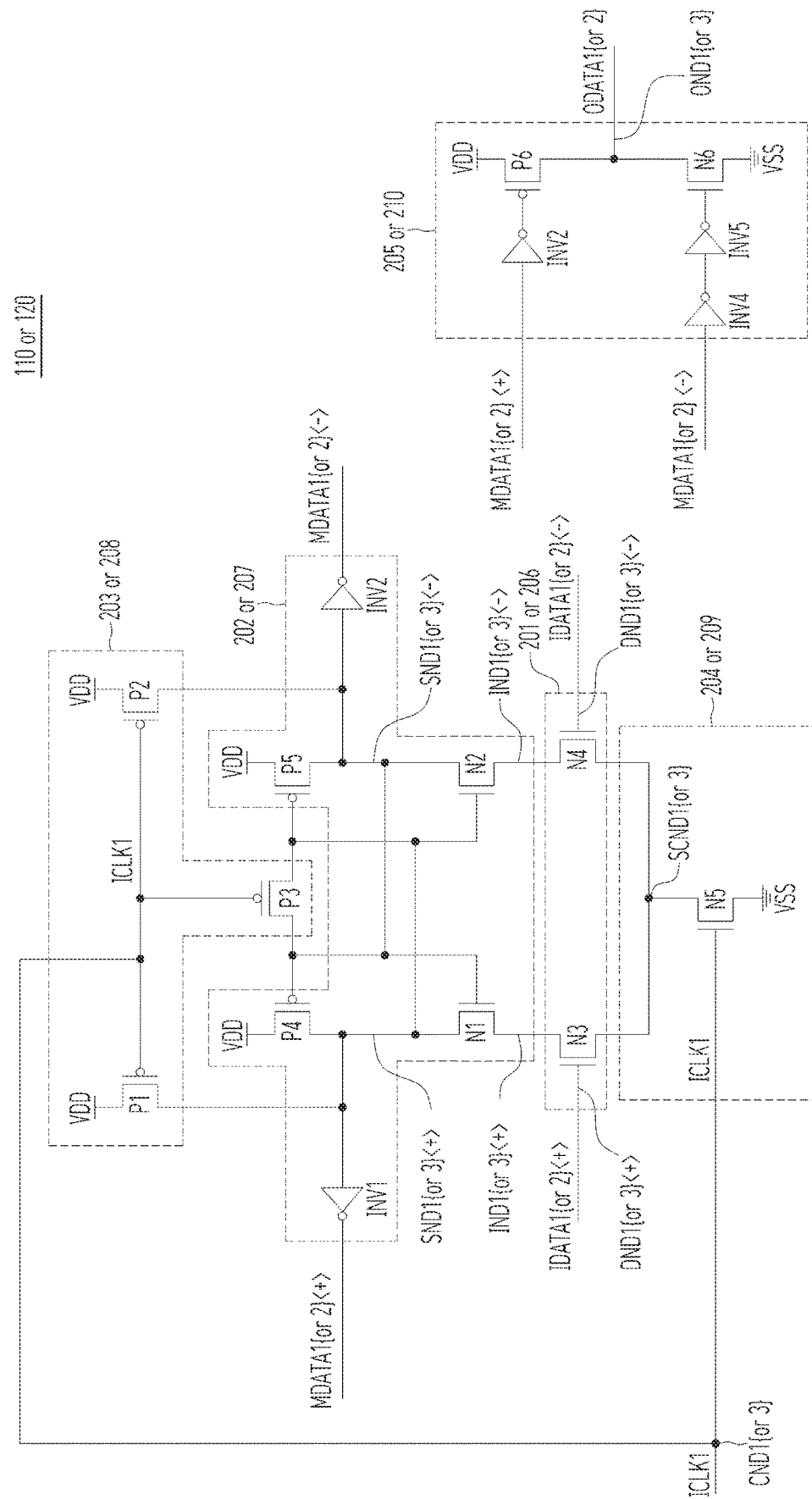
FIG. 2 is a diagram for describing a detailed circuit configuration of first and second data transmission circuits among components of the signal transmission circuit illustrated in FIG. 1.

FIG. 2 is a diagram for describing a detailed circuit configuration of the first and second data transmission circuits among the components of the signal transmission circuit illustrated in FIG. 1.

Figure 3A:
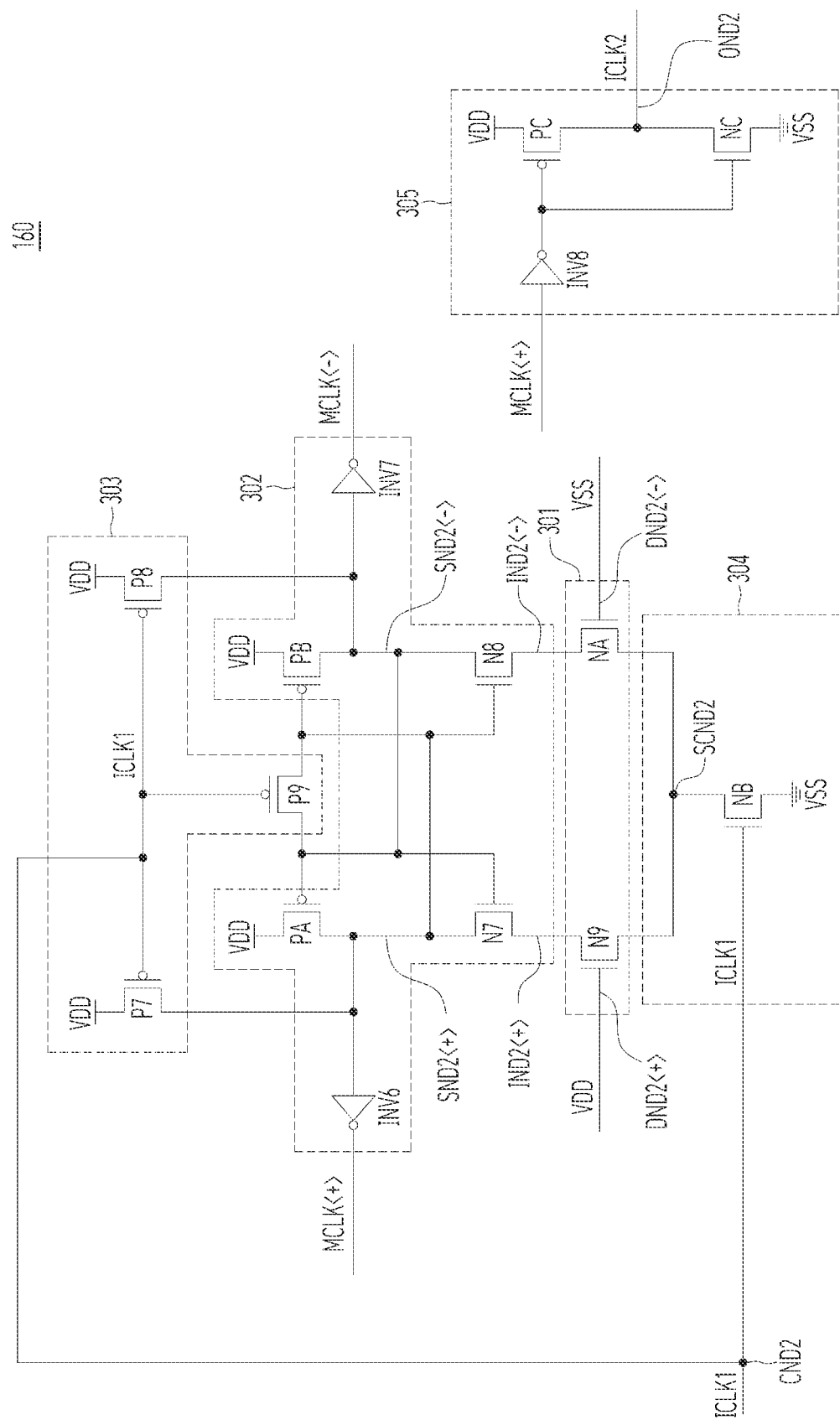
FIG. 3A and FIG. 3B are diagrams for describing a detailed circuit configuration of a clock transmission circuit among the components of the signal transmission circuit illustrated in FIG. 1.
Figure 3B:
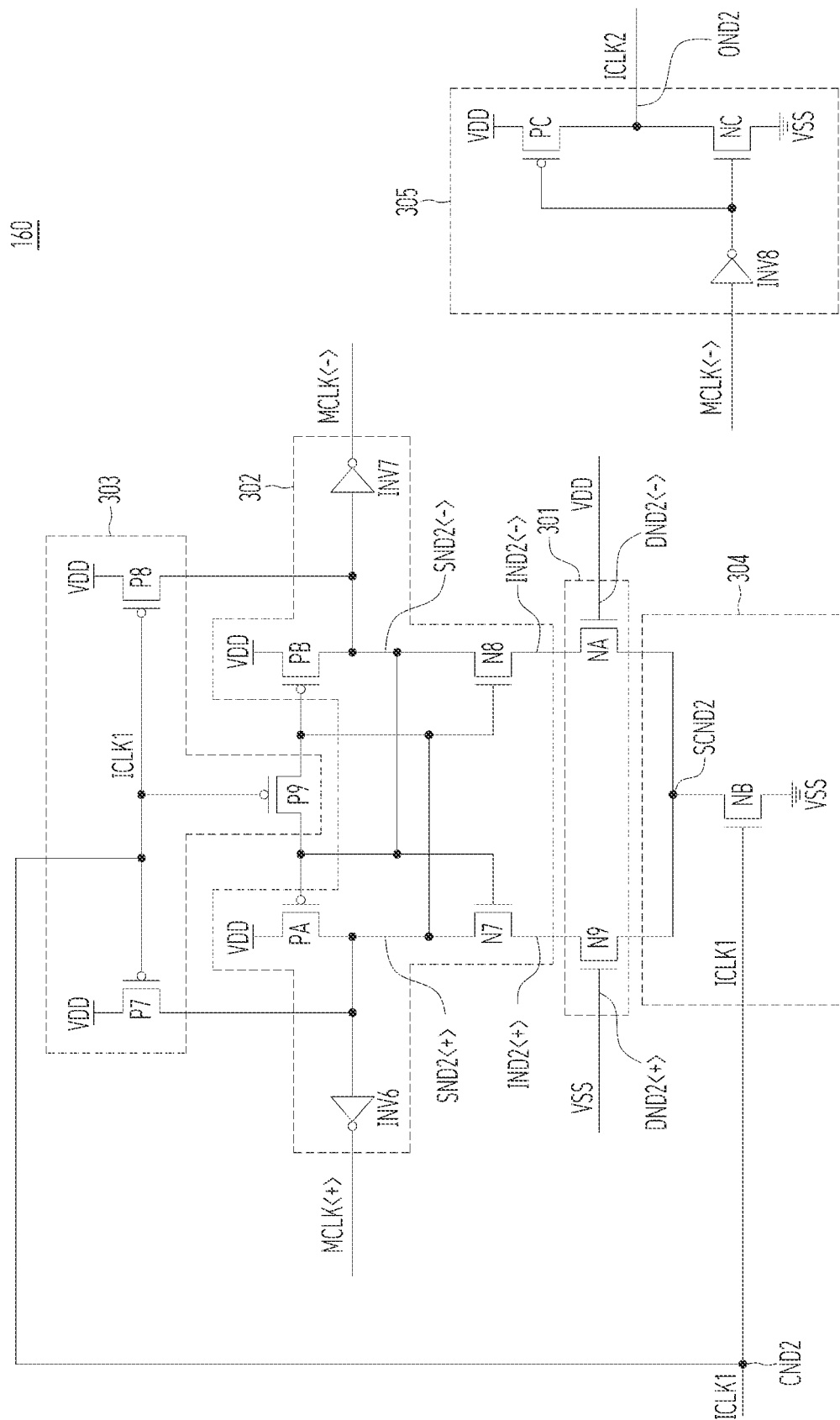

FIG. 3A and FIG. 3B are diagrams for describing a detailed circuit configuration of the clock transmission circuit among the components of the signal transmission circuit illustrated in FIG. 1.

Referring to FIG. 2, the first data transmission circuit 110 may include a first input section 201, a first sensing and amplifying section 202, first supply sections 203 and 204, and a first output section 205.

The first input section 201 may change a voltage level pair of a first input node pair IND1<+,-> in response to the first input data pair IDATA1<+,-> applied to the first differential input node pair DND1<+,->.

The first sensing and amplifying section 202 may sense and amplify a change in the voltage level pair of the first input node pair IND1<+,->, and output a first intermediate data pair MDATA1<+,->.

The first supply sections 203 and 204 may supply the power supply voltage VDD and the ground voltage VSS to the first input section 201 and the first sensing and amplifying section 202 in response to the first operation clock ICLK1 applied to the first clock input node CND1.

The first output section 205 may output the first output data ODATA1 through the first data output node OND1 in response to the first intermediate data pair MDATA1<+,->.

More specifically, the first supply sections 203 and 204 may include an NMOS transistor N5 for connecting a ground voltage VSS node and a first sourcing node SCND1 in response to the first operation clock ICLK1 applied to the first clock input node CND1, and three PMOS transistors P1 to P3 for connecting a power supply voltage VDD node and a first sensing node pair SND1<+,-> in response to the first operation clock ICLK1 applied to the first clock input node CND1. The first operation clock ICLK1 may be a signal that repeatedly toggles between logic 'high' and logic 'low'. Accordingly, when the first operation clock ICLK1 is at logic 'high', the first supply sections 203 and 204 may supply the ground voltage VSS to the first sourcing node SCND1, and simultaneously may not supply the power supply voltage VDD to the first sensing node pair SND1<+,->. Furthermore, when the first operation clock ICLK1 is at logic 'low', the first supply sections 203 and 204 may not supply the ground voltage VSS to the first sourcing node SCND1, and simultaneously may supply the power supply voltage VDD to the first sensing node pair SND1<+,->.

The first input section 201 may include two NMOS transistors N3 and N4 connected between the first sourcing node SCND1 and the first input node pair IND1<+,->, and of the two NMOS transistors N3 and N4, one transistor is turned on and the other transistor is turned off according to a value of the first input data pair IDATA1<+,-> applied to the first differential input node pair DND1<+,->. That is, of the first input node pair IND1<+,->, one node may be connected to the first sourcing node SCND1 and the other node may not be connected to the first sourcing node SCND1 according to the value of the first input data pair IDATA1<+,-> applied to the first differential input node pair DND1<+,->. A potential level of the first input node pair IND1<+,-> may be adjusted according to which node of the first input node pair IND1<+,-> is connected to the first sourcing node SCND1.

The first sensing and amplifying section 202 may include two NMOS transistors N1 and N2 connected between the first input node pair IND1<+,-> and the first sensing node pair SND1<+,->, two PMOS transistors P4 and P5 connected between the first sensing node pair SND1<+,-> and the power supply voltage VDD node, and two inverters INV1 and INV2 that determine a logic level of the first intermediate data pair MDATA1<+,-> according to a potential level of the first sensing node pair SND1<+,->. In such a case, a positive node <+> of the first sensing node pair SND1<+,-> may be connected to a negative node <-> of the first sensing node pair SND1<+,-> and gates of the PMOS transistor P5 and the NMOS transistor N2 connected in series between the power supply voltage VDD node and a negative node <-> of the first input node pair IND1<+,->. A negative node <-> of the first sensing node pair SND1<+,-> may be connected to a positive node <+> of the first sensing node pair SND1<+,-> and gates of the PMOS transistor P4 and the NMOS transistor N1 connected in series between the power supply voltage VDD node and a positive node <+> of the first input node pair IND1<+,->. While the first operation clock ICLK1 is at logic 'high', when the potential level of the first sensing node pair SND1<+,-> is adjusted as the potential level of the first input node pair IND1<+,-> is adjusted by the first input section 201, the first sensing and amplifying section 202 may sense and amplify the adjusted potential level, and then determine the logic level of the first intermediate data pair MDATA1<+,-> through the inverters INV1 and INV2.

The first output section 205 may include an inverter INV3 and a PMOS transistor P6 for connecting the power supply voltage VDD node and the first data output node OND1 according to positive data<+> of the first intermediate data pair MDATA1<+,->, and two inverters INV4 and INV5 and an NMOS transistor N6 for connecting the ground voltage VSS node and the first data output node OND1 according to negative data <−> of the first intermediate data pair MDATA1<+,−>.

On the other hand, FIG. 3A illustrating the clock transmission circuit 160 is a diagram for describing a case where the power supply voltage VDD and the ground voltage VSS are applied respectively to the positive and negative input nodes <+,−> of the second differential input node pair DND2<+,−>. In contrast, FIG. 3B illustrating the clock transmission circuit 160 is a diagram for describing a case where the power supply voltage VDD and the ground voltage VSS are applied respectively to the negative and positive nodes <−,+> of the second differential input node pair DND2<+,−>. Accordingly, reference numerals of parts with no difference in FIG. 3A and FIG. 3B may be identical to each other.

Referring to FIG. 3A and FIG. 3B together, the clock transmission circuit 160 may include a second input section 301, a second sensing and amplifying section 302, second supply sections 303 and 304, and a second output section 305.

The second input section 301 may change a voltage level pair of a second input node pair IND2<+,−> in response to the power supply voltage VDD and the ground voltage VSS applied to the second differential input node pair DND2<+,−>. Accordingly, in FIG. 3A in which the power supply voltage VDD and the ground voltage VSS are applied respectively to the positive and negative input nodes <+,−> of the second differential input node pair DND2<+,−>, the power supply voltage VDD may be applied to the positive input node <+> of the second differential input node pair DND2<+,−> and the ground voltage VSS may be applied to the negative input node <−> thereof. In contrast, in FIG. 3B in which the power supply voltage VDD and the ground voltage VSS are applied respectively to the negative and positive nodes <−,+> of the second differential input node pair DND2<+,−>, the ground voltage VSS may be applied to the positive input node <+> of the second differential input node pair DND2<+,−> and the power supply voltage VDD may be applied to the negative input node <−> thereof.

The second sensing and amplifying section 302 may sense and amplify a change in the voltage level pair of the second input node pair IND2<+,−>, and output an intermediate clock pair MCLK<+,−>.

The second supply sections 303 and 304 may supply the power supply voltage VDD and the ground voltage VSS to the second input section 301 and the second sensing and amplifying section 302 in response to the first operation clock ICLK1 applied to the second clock input node CND2.

The second output section 305 may output the second operation clock ICLK2 through the second data output node OND2 in response to at least one clock within the intermediate clock pair MCLK<+,−>.

More specifically, the second supply sections 303 and 304 may include an NMOS transistor NB for connecting the ground voltage VSS node and a second sourcing node SCND2 in response to the first operation clock ICLK1 applied to the second clock input node CND2, and three PMOS transistors P7 to P9 for connecting the power supply voltage VDD node and a second sensing node pair SND2<+,−> in response to the first operation clock ICLK1 applied to the second clock input node CND2. The first operation clock ICLK1 may be a signal that repeatedly toggles between logic 'high' and logic 'low'. Accordingly, when the first operation clock ICLK1 is at logic 'high', the second supply sections 303 and 304 may supply the ground voltage VSS to the second sourcing node SCND2, and simultaneously may not supply the power supply voltage VDD to the second sensing node pair SND2<+,−>. Furthermore, when the first operation clock ICLK1 is at logic 'low', the second supply sections 303 and 304 may not supply the ground voltage VSS to the second sourcing node SCND2, and simultaneously may supply the power supply voltage VDD to the second sensing node pair SND2<+,−>.

As illustrated in FIG. 3A, the second input section 301 may include an NMOS transistor N9 that is connected between the second sourcing node SCND2 and the second input node pair IND2<+,−>, and maintains a turned-on state in response to the power supply voltage VDD applied to the positive input node <+> of the second differential input node pair DND2<+,−>, and an NMOS transistor NA that maintains a turned-off state in response to the ground voltage VSS applied to the negative input node <−> of the second differential input node pair DND2<+,−>. That is, in the second input section 301 illustrated in FIG. 3A, a positive node <+> of the second input node pair IND2<+,−> may always be connected to the second sourcing node SCND2, and a negative node <−> thereof may not always be connected to the second sourcing node SCND2.

As illustrated in FIG. 3B, the second input section 301 may include the NMOS transistor N9 that is connected between the second sourcing node SCND2 and the second input node pair IND2<+,−>, and maintains a turned-off state in response to the ground voltage VSS applied to the positive input node <+> of the second differential input node pair DND2<+,−>, and the NMOS transistor NA that maintains a turned-on state in response to the power supply voltage VDD applied to the negative input node <−> of the second differential input node pair DND2<+,−>. That is, in the second input section 301 illustrated in FIG. 3B, the positive node <+> of the second input node pair IND2<+,−> may not always be connected to the second sourcing node SCND2, and the negative node <−> thereof may always be connected to the second sourcing node SCND2.

The second sensing and amplifying section 302 may include two NMOS transistors N7 and N8 connected between the second input node pair IND2<+,−> and the second sensing node pair SND2<+,−>, two PMOS transistors PA and PB connected between the second sensing node pair SND2<+,−> and the power supply voltage VDD node, and two inverters INV6 and INV7 that determine a logic level of the intermediate clock pair MCLK<+,−> according to a potential level of the second sensing node pair SND2<+,−>. In such a case, a positive node <+> of the second sensing node pair SND2<+,−> may be connected to a negative node <−> of the second sensing node pair SND2<+,−> and gates of the PMOS transistor PB and the NMOS transistor N8 connected in series between the power supply voltage VDD node and a negative node <−> of the second input node pair IND2<+,−>. The negative node <−> of the second sensing node pair SND2<+,−> may be connected to the positive node <+> of the second sensing node pair SND2<+,−> and gates of the PMOS transistor PA and the NMOS transistor N7 connected in series between the power supply voltage VDD node and a positive node <+> of the second input node pair IND2<+,−>.

Referring to FIG. 3A, when the first operation clock ICLK1 is at logic 'high', the second sensing and amplifying section 302 may supply the ground voltage VSS to the positive node <+> of the second sensing node pair SND2<+,−> and float the negative node <−> thereof. Accordingly, when the first operation clock ICLK1 is at logic 'high', the second sensing and amplifying section 302 may adjust a positive clock <+> of the intermediate clock pair MCLK<+,-> to logic 'high' and adjust a negative clock <-> thereof to logic 'low'. In contrast, when the first operation clock ICLK1 is at logic 'low', the second sensing and amplifying section 302 may supply the power supply voltage VDD to both the positive node <+> and the negative node <-> of the second sensing node pair SND2<+,->. Accordingly, when the first operation clock ICLK1 is at logic 'low', the second sensing and amplifying section 302 may adjust the positive clock <+> and the negative clock <-> of the intermediate clock pair MCLK<+,-> to logic 'low'.

The second output section 305 may include an inverter INV8, a PMOS transistor PC, and an NMOS transistor NC for connecting the second data output node OND2 to the power supply voltage VDD node or the ground voltage VSS node according to the positive clock <+> of the intermediate clock pair MCLK<+,->. That is, when the first operation clock ICLK1 is at logic 'high', the second output section 305 may drive the second operation clock ICLK2 with the power supply voltage VDD corresponding to logic 'high' in response to the adjustment of the positive clock <+> of the intermediate clock pair MCLK<+,-> to logic 'high'. In contrast, when the first operation clock ICLK1 is at logic 'low', the second output section 305 may drive the second operation clock ICLK2 with the ground voltage VSS corresponding to logic 'low' in response to the adjustment of the positive clock <+> of the intermediate clock pair MCLK<+,-> to logic 'low'.

Referring to FIG. 3B, when the first operation clock ICLK1 is at logic 'high', the second sensing and amplifying section 302 may float the positive node <+> of the second sensing node pair SND2<+,-> and supply the ground voltage VSS to the negative node <-> thereof. Accordingly, when the first operation clock ICLK1 is at logic 'high', the second sensing and amplifying section 302 may adjust the positive clock <+> of the intermediate clock pair MCLK<+,-> to logic 'low' and adjust the negative clock <-> thereof to logic 'high'. In contrast, when the first operation clock ICLK1 is at logic 'low', the second sensing and amplifying section 302 may supply the power supply voltage VDD to both the positive node <+> and the negative node <-> of the second sensing node pair SND2<+,->. Accordingly, when the first operation clock ICLK1 is at logic 'low', the second sensing and amplifying section 302 may adjust the positive clock <+> and the negative clock <-> of the intermediate clock pair MCLK<+,-> to logic 'low'.

The second output section 305 may include the inverter INV8, the PMOS transistor PC, and the NMOS transistor NC for connecting the second data output node OND2 to the power supply voltage VDD node or the ground voltage VSS node according to the negative clock <-> of the intermediate clock pair MCLK<+,->. That is, when the first operation clock ICLK1 is at logic 'high', the second output section 305 may drive the second operation clock ICLK2 with the power supply voltage VDD corresponding to logic 'high' in response to the adjustment of the negative clock <-> of the intermediate clock pair MCLK<+,-> to logic 'high'. In contrast, when the first operation clock ICLK1 is at logic 'low', the second output section 305 may drive the second operation clock ICLK2 with the ground voltage VSS corresponding to logic 'low' in response to the adjustment of the negative clock <-> of the intermediate clock pair MCLK<+,-> to logic 'low'.

When comparing the detailed circuit of the first data transmission circuit 110 illustrated in FIG. 2 with the detailed circuit of the clock transmission circuit 160 illustrated in FIG. 3A or FIG. 3B, it can be seen that the connection relationships among all elements, that is, the connection relationships among the NMOS transistors, the PMOS transistors, and the inverters are the same. It can be seen that the difference lies in what an inputted signal is and an outputted signal is, that is, whether the inputted signal is the first input data pair IDATA1<+,->, the power supply voltage VDD, or the ground voltage VSS, and whether the outputted signal is the first output data ODATA1 or the second operation clock ICLK2. In this way, since the first data transmission circuit 110 is modeled on the clock transmission circuit 160, an influence due to PVT variations may be identically applied to the clock transmission circuit 160 and the first data transmission circuit 110. Although not directly illustrated in the drawings, in the first data transmission circuit 110 illustrated in FIG. 2 and the clock transmission circuit 160 illustrated in FIG. 3A or FIG. 3B, all elements corresponding to each other may have the same size. For example, the two NMOS transistors N3 and N4 included in the first input section 201 of the first data transmission circuit 110 and the two NMOS transistors N9 and NA included in the second input section 301 included in the clock transmission circuit 160 may have the same size.

Referring now back to FIG. 2, the second data transmission circuit 120 may include a third input section 206, a third sensing and amplifying section 207, third supply sections 208 and 209, and a third output section 210.

The third input section 206 may change a voltage level pair of a third input node pair IND3<+,-> in response to the second input data pair IDATA2<+,-> applied to the third differential input node pair DND3<+,->.

The third sensing and amplifying section 207 may sense and amplify a change in the voltage level pair of the third input node pair IND3<+,->, and output a second intermediate data pair MDATA2<+,->.

The third supply sections 208 and 209 may supply the power supply voltage VDD and the ground voltage VSS to the third input section 206 and the third sensing and amplifying section 207 in response to the first operation clock ICLK1 applied to the third clock input node CND3.

The third output section 210 may output the second output data ODATA2 to the third data output node OND3 in response to the second intermediate data pair MDATA2<+,->.

As can be seen from FIG. 2, in each of the first data transmission circuit 110 and the second data transmission circuit 120, the connection relationships among all elements included therein, that is, the connection relationships among the NMOS transistors, the PMOS transistors, and the inverters are the same. It can be seen that the difference lies in what an inputted signal is and an outputted signal is, that is, whether the inputted signal is the first input data pair IDATA1<+,-> or the second input data pair IDATA2<+,->, and whether the outputted signal is the first output data ODATA1 or the second output data ODATA2. Accordingly, since the specific configuration and operation of the second data transmission circuit 120 is substantially the same as that of the first data transmission circuit 110, description of the second data transmission circuit 120 is omitted.

SECOND EMBODIMENT

Figure 4:
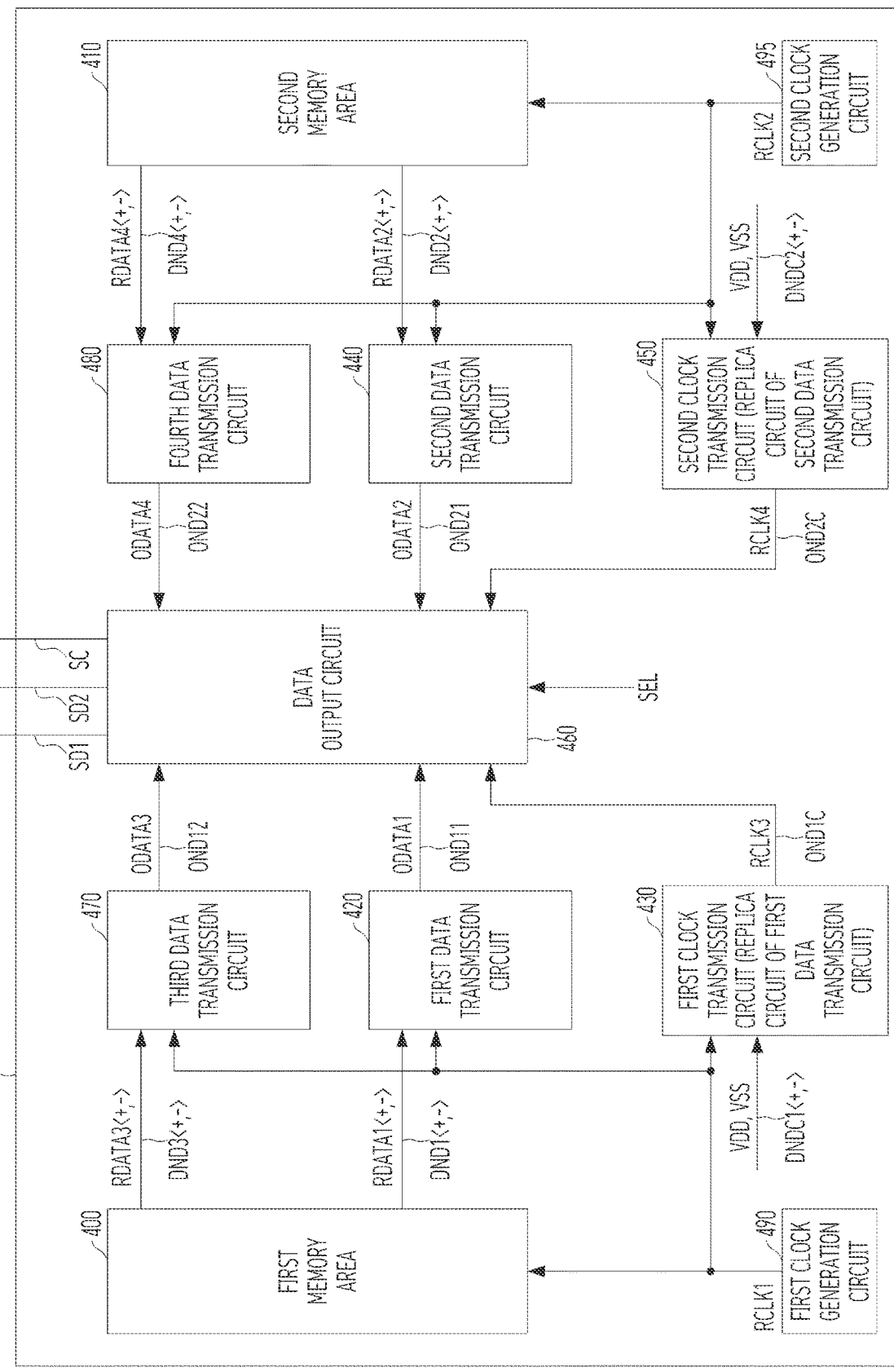
FIG. 4 is a diagram for describing an example of a signal transmission circuit for transmitting a read clock and read data in a memory device according to a second embodiment of the present disclosure.

FIG. 4 is a diagram for describing an example of a signal transmission circuit for transmitting a read clock and read data in a memory device 150 according to a second embodiment of the present disclosure.

Referring to FIG. 4, the memory device 150 may include a first memory area 400, a second memory area 410, a first data transmission circuit 420, a first clock transmission circuit 430, a second data transmission circuit 440, a second clock transmission circuit 450, a data output circuit 460, a third data transmission circuit 470, a fourth data transmission circuit 480, a first clock generation circuit 490, and a second clock generation circuit 495.

The first memory area 400 and the second memory area 410 may be disposed in physically separated areas. In such a case, the fact that the two areas are physically separated and disposed may mean that a distance between the two physically separated areas is equal to or greater than at least a set distance. The set distance may refer to a distance at which other physical components may be disposed, and may be adjusted according to the type, size, and the like of the memory device 150.

Each of the first memory area 400 and the second memory area 410 may include a plurality of memory cells (not illustrated) for storing data. For example, data inputted from the outside through a program operation may be stored in at least one of the first memory area 400 and the second memory area 410. Data stored in at least one of the first memory area 400 and the second memory area 410 may be outputted through a read operation.

Specifically, the first memory area 400 may internally read first read data pair RDATA1<+,−> in response to a first read clock RCLK1.

The second memory area 410 may internally read second read data pair RDATA2<+,−> in response to a second read clock RCLK2.

In such a case, the time point when the first read data pair RDATA1<+,−> is read from the first memory area 400 may be different from the time point when the second read data pair RDATA2<+,−> is read from the second memory area 410.

The first data transmission circuit 420 may output, to a first data line OND11 among first lines, first output data ODATA1 obtained by sensing and amplifying the first read data pair RDATA1<+,−> applied to an internal differential data input node pair DND1<+,−> in response to the first read clock RCLK1.

The first clock transmission circuit 430, on which the first data transmission circuit 420 is modeled, may output, to a clock line OND1C among the first lines, a third read clock RCLK3 generated in response to the first read clock RCLK1 while a power supply voltage VDD and a ground voltage VSS are applied to an internal differential data input node pair DNDC1<+,−>. In such a case, the fact that the power supply voltage VDD and the ground voltage VSS are applied respectively to the positive and negative input nodes <+,−> of the differential data input node pair DNDC1<+,−> inside the first clock transmission circuit 430 may mean that the power supply voltage VDD is applied to a positive input node <+> of the differential data input node pair DNDC1<+,−> inside the first clock transmission circuit 430, and the ground voltage VSS is applied to a negative input node <−> thereof. In contrast, the fact that the power supply voltage VDD and the ground voltage VSS are applied respectively to the negative and positive nodes <−,+> of the differential data input node pair DNDC1<+,−> inside the first clock transmission circuit 430 may mean that the ground voltage VSS is applied to the positive input node <+> of the differential data input node pair DNDC1<+,−> inside the first clock transmission circuit 430, and the power supply voltage VDD is applied to the negative input node <−> thereof.

The second data transmission circuit 440 may output, to a first data line OND21 among second lines, second output data ODATA2 obtained by sensing and amplifying the second read data pair RDATA2<+,−> applied to an internal differential data input node pair DND2<+,−> in response to the second read clock RCLK2.

The second data transmission circuit 440 is modeled on the second clock transmission circuit 450, and may output, to a clock line OND2C among the second lines, a fourth read clock RCLK4 generated in response to the second read clock RCLK2 while the power supply voltage VDD and the ground voltage VSS are applied to an internal differential data input node pair DNDC2<+,−>. In such a case, the fact that the power supply voltage VDD and the ground voltage VSS are applied respectively to the positive and negative input nodes <+,−> of the differential data input node pair DNDC2<+,−> inside the second clock transmission circuit 450 may mean that the power supply voltage VDD is applied to a positive input node <+> of the differential data input node pair DNDC2<+,−> inside the second clock transmission circuit 450, and the ground voltage VSS is applied to a negative input node <−> thereof. In contrast, the fact that the power supply voltage VDD and the ground voltage VSS are applied respectively to the negative and positive nodes <−,+> of the differential data input node pair DNDC2<+,−> inside the second clock transmission circuit 450 may mean that the ground voltage VSS is applied to the positive input node <+> of the differential data input node pair DNDC2<+,−> inside the second clock transmission circuit 450, and the power supply voltage VDD is applied to the negative input node <−> thereof.

The data output circuit 460 may be connected to the first lines OND11, OND12, and OND1C, the second lines OND21, OND22, and OND2C, and shared lines SD1, SD2, and SC, and may output, to a first data line SD1 among the shared lines, any one of the first output data ODATA1 synchronized with the third read clock RCLK3 and the second output data ODATA2 synchronized with the fourth read clock RCLK4.

Specifically, the data output circuit 460 may be connected to the first lines OND11, OND12, and OND1C, the second lines OND21, OND22, and OND2C, and the shared lines SD1, SD2, and SC, respectively, and may allow the shared line to be shared with the first line and the second line. In such a case, the number of first lines, the number of second lines, and the number of shared lines may be the same number, which is at least two or more. For example, as illustrated in the drawing, the number of first lines, the number of second lines, and the number of shared lines may be three, respectively. The shared line may be connected to another component existing outside the memory device 150, for example, a memory controller (not illustrated).

More specifically, in a read operation, the data output circuit 460 may connect the first line and the shared line and simultaneously may not connect the second line and the shared line, thereby outputting, to the outside of the memory device 150, the first output data ODATA1 and the third read clock RCLK3 read from the first memory area 400 and transmitted through the first data transmission circuit 420 and the first clock transmission circuit 430. For example, in the read operation, the data output circuit 460 may connect three first lines and three shared lines, and simultaneously may not connect three second lines and the three shared lines.

Furthermore, in the read operation, the data output circuit 460 may connect the second line and the shared line and simultaneously may not connect the first line and the shared line, thereby outputting, to the outside of the memory device 150, the second output data ODATA2 and the fourth read clock RCLK4 read from the second memory area 410 and transmitted through the second data transmission circuit 440 and the second clock transmission circuit 450. For example, in the read operation, the data output circuit 460 may connect three second lines and three shared lines, and simultaneously may not connect three first lines and the three shared lines.

That is, in the read operation, the data output circuit 460 operates in a time division manner so that a section where the first line is connected to the shared line and a section where the second line is connected to the shared line do not overlap each other, thereby allowing the shared line to be shared with the first line and the second line.

On the other hand, the fact that the first data transmission circuit 420 is modeled on the first clock transmission circuit 430 may mean that the circuit configuration included in the first data transmission circuit 420 has been almost identically replicated and applied to the internal circuit configuration of the first clock transmission circuit 430.

In this way, since the first data transmission circuit 420 is modeled on the first clock transmission circuit 430, an influence due to PVT variations may be identically applied to the first clock transmission circuit 430 and the first data transmission circuit 420. For example, the amount of delay, which varies by the PVT variations in the process in which the first read data pair RDATA1<+,-> is inputted to the first data transmission circuit 420 in response to the first read clock RCLK1 and then is outputted as the first output data ODATA1, may be identical to the amount of delay varying by the PVT variations in the process in which the first read clock RCLK1 is outputted from the first clock transmission circuit 430 as the second read clock RCLK2. Accordingly, it is possible to maximally secure a margin window meaning a range in which the value of the first output data ODATA1 may be accurately recognized based on the toggling of the second read clock RCLK2. That is, when the data output circuit 460 outputs the first output data ODATA1 in synchronization with the second read clock RCLK2, the probability that the value of the first output data ODATA1 is accurately recognized may be greatly increased.

Similarly, the fact that the second data transmission circuit 440 is modeled on the second clock transmission circuit 450 may mean that the circuit configuration included in the second data transmission circuit 440 has been almost identically replicated and applied to the internal circuit configuration of the second clock transmission circuit 450.

In this way, since the second data transmission circuit 440 is modeled on the second clock transmission circuit 450, an influence due to PVT variations may be identically applied to the second clock transmission circuit 450 and the second data transmission circuit 440. For example, the amount of delay, which varies by the PVT variations in the process in which the second read data pair RDATA2<+,-> is inputted to the second data transmission circuit 440 in response to the second read clock RCLK2 and then is outputted as the second output data ODATA2, may be identical to the amount of delay varying by the PVT variations in the process in which the second read clock RCLK2 is outputted from the second clock transmission circuit 450 as the fourth read clock RCLK4. Accordingly, it is possible to maximally secure a margin window meaning a range in which the value of the second output data ODATA2 may be accurately recognized based on the toggling of the fourth read clock RCLK4. That is, when the data output circuit 460 outputs the second output data ODATA2 in synchronization with the fourth read clock RCLK4, the probability that the value of the second output data ODATA2 is accurately recognized may be greatly increased.

The first memory area 400 may read third read data pair RDATA3<+,-> in response to the first read clock RCLK1 at the same time point when the first read data pair RDATA1<+,-> is read. That is, the first memory area 400 may read the first read data pair RDATA1<+,-> and the third read data pair RDATA3<+,-> in parallel in response to the first read clock RCLK1.

The third data transmission circuit 470 may output, to a second data line OND12 among the first lines, third output data ODATA3 obtained by sensing and amplifying the third read data pair RDATA3<+,-> applied to an internal differential data input node pair DND3<+,-> in response to the first read clock RCLK1.

The data output circuit 460 may output the third output data ODATA3 synchronized with the third read clock RCLK3 to a second data line SD2 among the shared lines at the same time point when the first output data ODATA1 synchronized with the third read clock RCLK3 is outputted to the first data line SD1 among the shared lines.

In summary, the time point when the first read data pair RDATA1<+,-> read in parallel from the first memory area 400 is applied to the first data transmission circuit 420 may be identical to the time point when the third read data pair RDATA3<+,-> is applied to the third data transmission circuit 470. That is, the first read data pair RDATA1<+,-> and the third read data pair RDATA3<+,-> may be applied to the first data transmission circuit 420 and the third data transmission circuit 470 in parallel.

In this way, the first data transmission circuit 420 and the third data transmission circuit 470 may sense and amplify different data inputted in parallel at the same time point and output the amplified data in parallel. That is, the first data transmission circuit 420 and the third data transmission circuit 470 may receive, sense, and amplify the first read data pair RDATA1<+,-> and the third read data pair RDATA3<+,-> inputted in parallel at the same time point, and output the amplified data as the first output data ODATA1 and the third output data ODATA3 in parallel.

Accordingly, an influence due to PVT variations may be identically applied to the first data transmission circuit 420 and the third data transmission circuit 470. For example, the amount of delay, which varies by the PVT variations in the process in which the first read data pair RDATA1<+,-> is inputted to the first data transmission circuit 420 in response to the first read clock RCLK1 and then is outputted as the first output data ODATA1, may be identical to the amount of delay varying by the PVT variations in the process in which the third read data pair RDATA3<+,-> is inputted to the third data transmission circuit 470 in response to the first read clock RCLK1 and then is outputted as the third output data ODATA3.

As described above, since an influence due to PVT variations may be identically applied to the first clock transmission circuit 430 and the first data transmission circuit 420, and may be identically applied to the first data transmission circuit 420 and the third data transmission circuit 470, the influence due to PVT variations may also be identically applied to the first clock transmission circuit 430 and the third data transmission circuit 470. Accordingly, a margin window meaning a range in which the value of the third output data ODATA3 may be accurately recognized based on the toggling of the second read clock RCLK2 may be maximally secured. That is, when the data output circuit 460 outputs the third output data ODATA3 in synchronization with the third read clock RCLK3, the probability that the value of the third output data ODATA3 is accurately recognized may be greatly increased.

The second memory area 410 may read fourth read data pair RDATA4<+,−> in response to the second read clock RCLK2 at the same time point when the second read data pair RDATA2<+,−> is read. That is, the second memory area 410 may read the second read data pair RDATA2<+,−> and the fourth read data pair RDATA4<+,−> in parallel in response to the second read clock RCLK2.

The fourth data transmission circuit 480 may output, to a second data line OND22 among the second lines, fourth output data ODATA4 obtained by sensing and amplifying the fourth read data pair RDATA4<+,−> applied to an internal differential data input node pair DND4<+,−> in response to the second read clock RCLK2.

The data output circuit 460 may output the fourth output data ODATA4 synchronized with the fourth read clock RCLK4 to the second data line SD2 among the shared lines at the same time point when the second output data ODATA2 synchronized with the fourth read clock RCLK4 is outputted to the first data line SD1 among the shared lines.

In summary, the time point when the second read data pair RDATA2<+,−> read in parallel from the second memory area 410 is applied to the second data transmission circuit 440 may be identical to the time point when the fourth read data pair RDATA4<+,−> is applied to the fourth data transmission circuit 480. That is, the second read data pair RDATA2<+,−> and the fourth read data pair RDATA4<+,−> may be applied to the second data transmission circuit 440 and the fourth data transmission circuit 480 in parallel.

In this way, the second data transmission circuit 440 and the fourth data transmission circuit 480 may sense and amplify different data inputted in parallel at the same time point and output the amplified data in parallel. That is, the second data transmission circuit 440 and the fourth data transmission circuit 480 may receive, sense, and amplify the second read data pair RDATA2<+,−> and the fourth read data pair RDATA4<+,−> inputted in parallel at the same time point, and output the amplified data as the second output data ODATA2 and the fourth output data ODATA4 in parallel.

Accordingly, an influence due to PVT variations may be identically applied to the second data transmission circuit 440 and the fourth data transmission circuit 480. For example, the amount of delay, which varies by the PVT variations in the process in which the second read data pair RDATA2<+,−> is inputted to the second data transmission circuit 440 in response to the second read clock RCLK2 and then is outputted as the second output data ODATA2, may be identical to the amount of delay varying by the PVT variations in the process in which the fourth read data pair RDATA4<+,−> is inputted to the fourth data transmission circuit 480 in response to the second read clock RCLK2 and then is outputted as the fourth output data ODATA4.

As described above, since an influence due to PVT variations may be identically applied to the second clock transmission circuit 450 and the second data transmission circuit 440, and may be identically applied to the second data transmission circuit 440 and the fourth data transmission circuit 480, the influence due to PVT variations may also be identically applied to the second clock transmission circuit 450 and the fourth data transmission circuit 480. Accordingly, a margin window meaning a range in which the value of the fourth output data ODATA4 may be accurately recognized based on the toggling of the second read clock RCLK2 may be maximally secured. That is, when the data output circuit 460 outputs the fourth output data ODATA4 in synchronization with the fourth read clock RCLK4, the probability that the value of the fourth output data ODATA4 is accurately recognized may be greatly increased.

On the other hand, an influence due to PVT variations that may be identically applied to the first clock transmission circuit 430, the first data transmission circuit 420, and the third data transmission circuit 470 may be different from an influence due to PVT variations that may be identically applied to the second clock transmission circuit 450, the second data transmission circuit 440, and the fourth data transmission circuit 480.

That is, since the first memory area 400 and the second memory area 410 are included in one memory device 150, but are disposed in physically separate areas, the influence due to PVT variations that may be applied to the first clock transmission circuit 430, the first data transmission circuit 420, and the third data transmission circuit 470 corresponding to the first memory area 400 may be different from the influence due to PVT variations that may be applied to the second clock transmission circuit 450, the second data transmission circuit 440, and the fourth data transmission circuit 480 corresponding to the second memory area 410.

Figure 5:
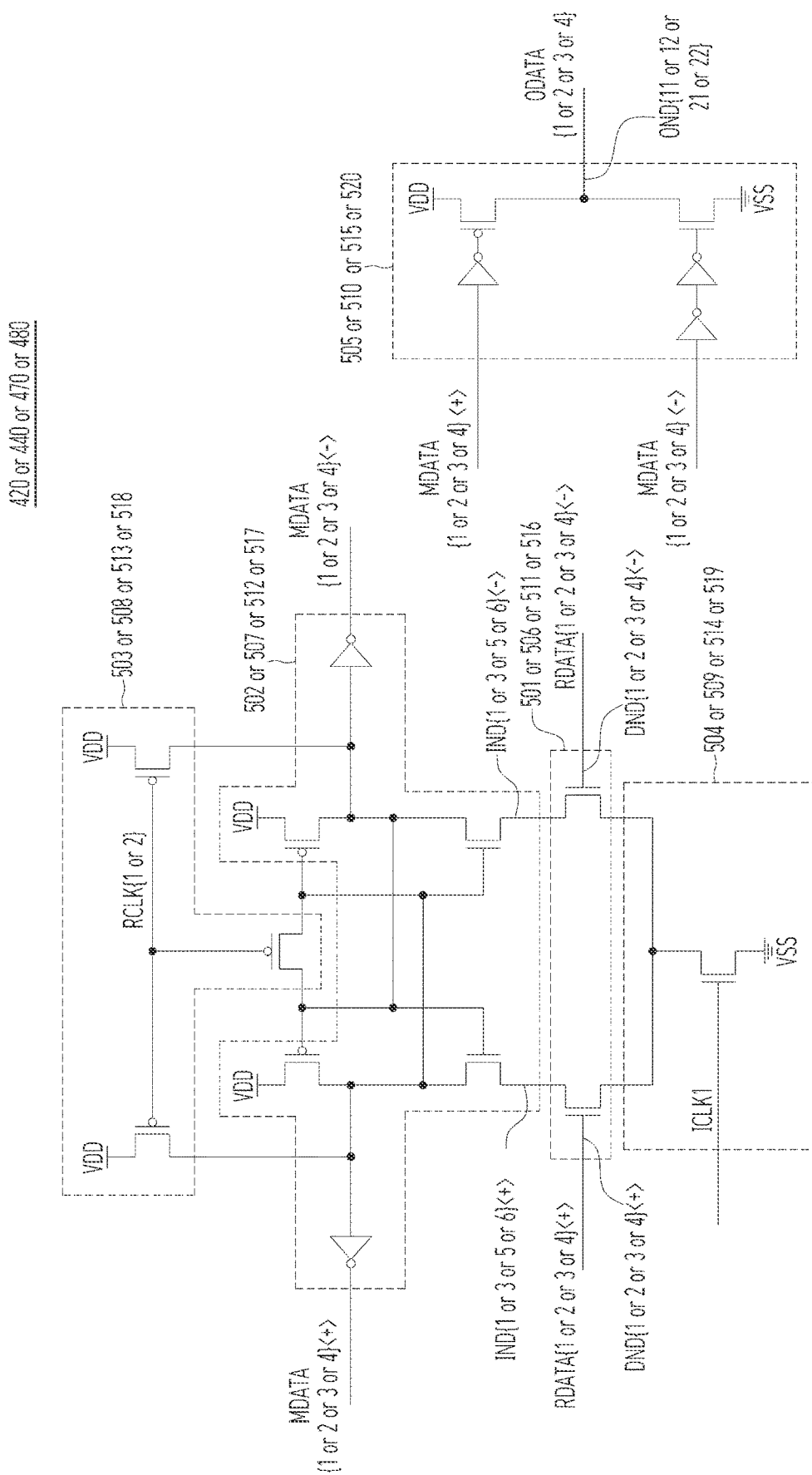
FIG. 5 is a diagram for describing a detailed circuit configuration of each of first to fourth data transmission circuits among components of the memory device illustrated in FIG. 4.

FIG. 5 is a diagram for describing a detailed circuit configuration of each of the first to fourth data transmission circuits among the components of the memory device illustrated in FIG. 4.

Figure 6A:
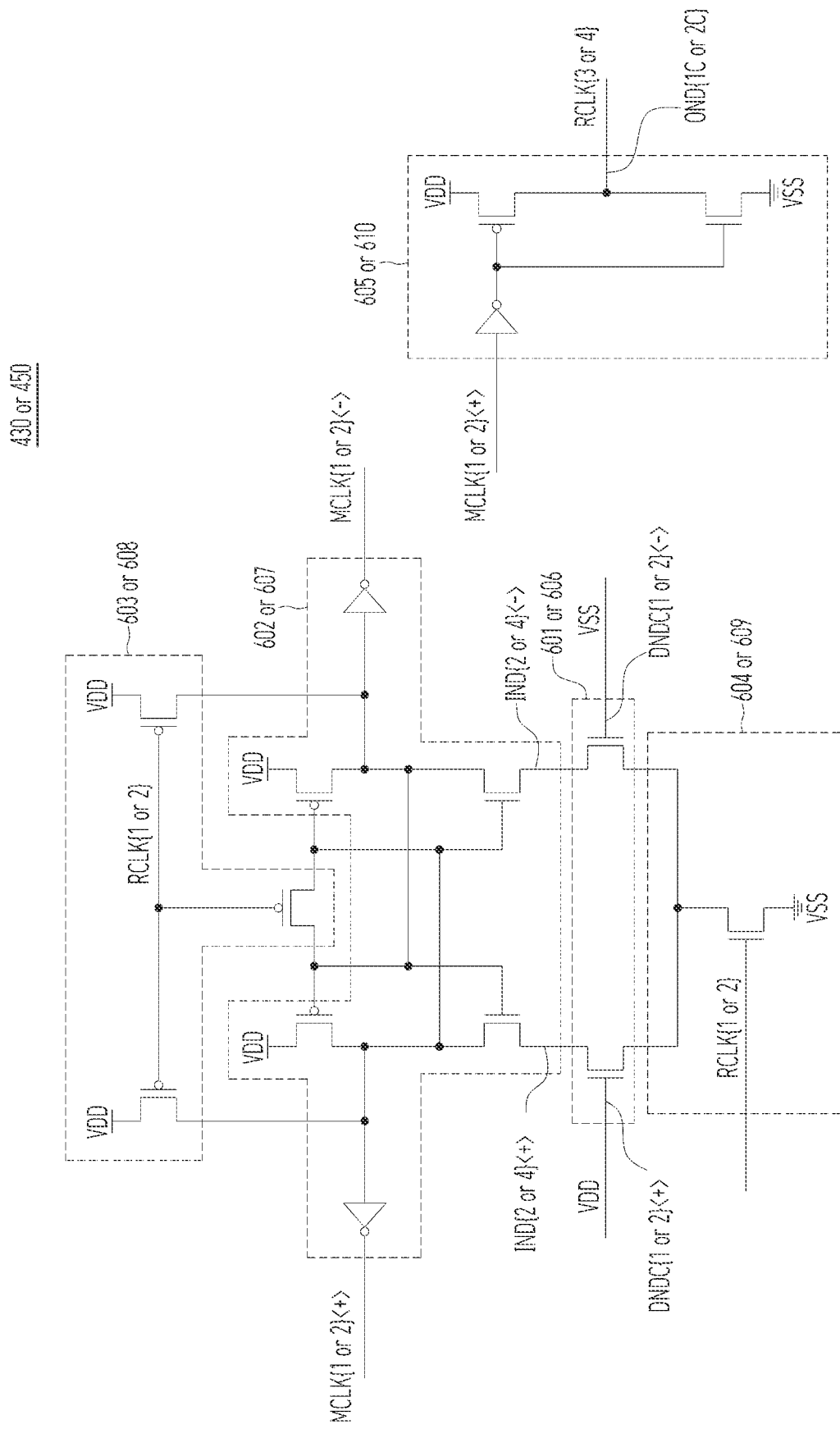
FIG. 6A and FIG. 6B are diagrams for describing a detailed circuit configuration of each of first and second clock transmission circuits among the components of the memory device illustrated in FIG. 4.
Figure 6B:
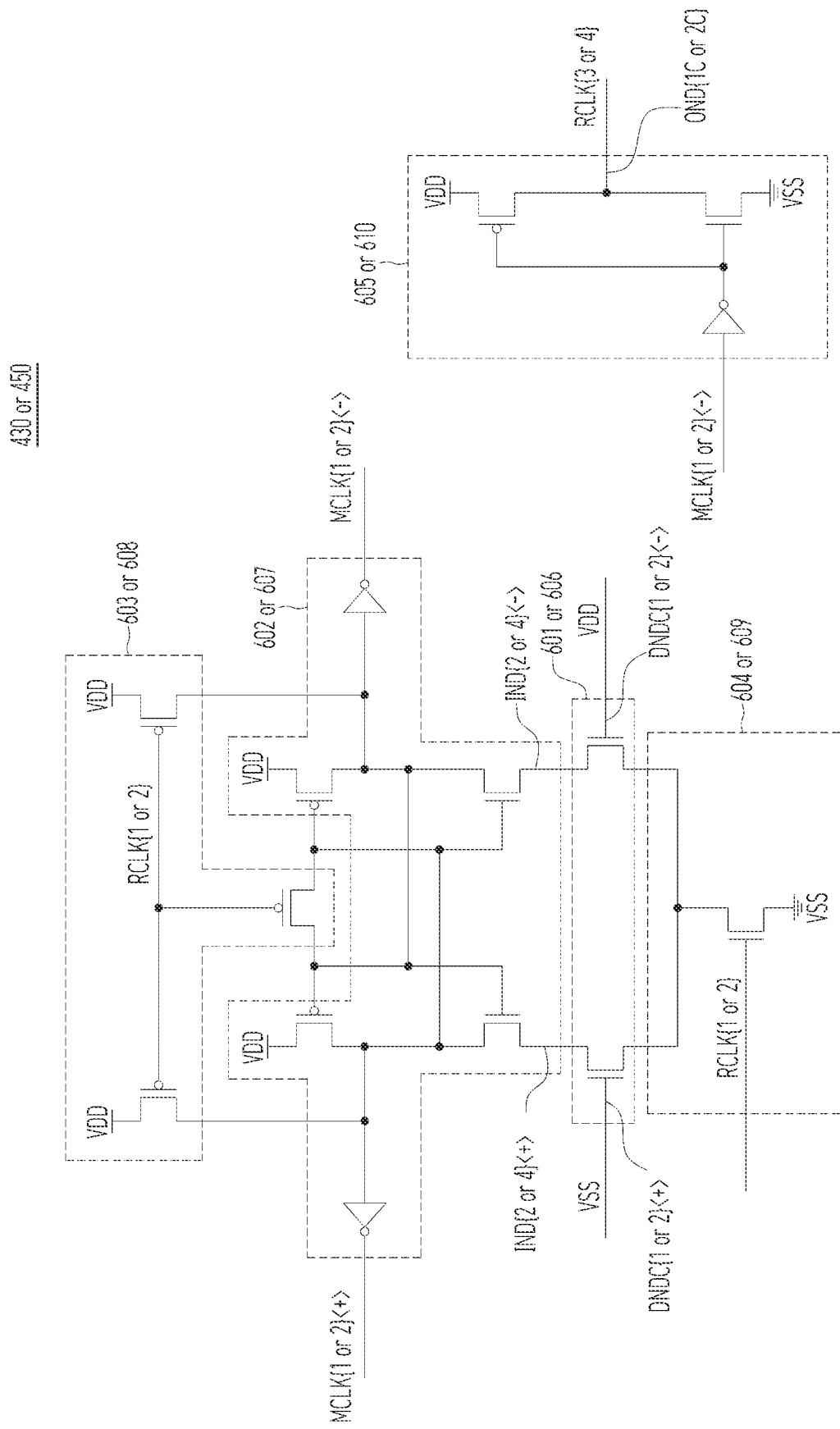

FIG. 6A and FIG. 6B are diagrams for describing a detailed circuit configuration of each of the first and second clock transmission circuits among the components of the signal transmission circuit illustrated in FIG. 4.

Referring to FIG. 5, the first data transmission circuit 420 may include a first input section 501, a first sensing and amplifying section 502, first supply sections 503 and 504, and a first output section 505.

The second data transmission circuit 440 may include a third input section 506, a third sensing and amplifying section 507, third supply sections 508 and 509, and a third output section 510.

The third data transmission circuit 470 may include a fifth input section 511, a fifth sensing and amplifying section 512, fifth supply sections 513 and 514, and a fifth output section 515.

The fourth data transmission circuit 480 may include a sixth input section 516, a sixth sensing and amplifying section 517, sixth supply sections 518 and 519, and a sixth output section 520.

The first input section 501 included in the first data transmission circuit 420 may change a voltage level pair of a first input node pair IND1<+,−> in response to the first read data pair RDATA1<+,−> applied to the internal differential data input node pair DND1<+,−>.

The first sensing and amplifying section 502 included in the first data transmission circuit 420 may sense and amplify a change in the voltage level pair of the first input node pair IND1<+,−>, and output a first intermediate data pair MDATA1<+,−>.

The first supply sections 503 and 504 included in the first data transmission circuit 420 may supply the power supply voltage VDD and the ground voltage VSS to the first input section 501 and the first sensing and amplifying section 502 in response to the first read clock RCLK1.

The first output section 505 included in the first data transmission circuit 420 may output the first output data ODATA1 to the first data line DND11 among the first lines in response to the first intermediate data pair MDATA1<+,->.

The third input section 506 included in the second data transmission circuit 440 may change a voltage level pair of a third input node pair IND3<+,-> in response to the second read data pair RDATA1<+,-> applied to the internal differential data input node pair DND2<+,->.

The third sensing and amplifying section 507 included in the second data transmission circuit 440 may sense and amplify a change in the voltage level pair of the third input node pair IND3<+,->, and output a second intermediate data pair MDATA2<+,->.

The third supply sections 508 and 509 included in the second data transmission circuit 440 may supply the power supply voltage VDD and the ground voltage VSS to the third input section 506 and the third sensing and amplifying section 507 in response to the second read clock RCLK2.

The third output section 510 included in the second data transmission circuit 440 may output the second output data ODATA2 to the first data line DND21 among the second lines in response to the second intermediate data pair MDATA2<+,->.

The fifth input section 511 included in the third data transmission circuit 470 may change a voltage level pair of a fifth input node pair IND5<+,-> in response to the third read data pair RDATA3<+,-> applied to the internal differential data input node pair DND3<+,->.

The fifth sensing and amplifying section 512 included in the third data transmission circuit 470 may sense and amplify a change in the voltage level pair of the fifth input node pair IND5<+,->, and output a third intermediate data pair MDATA3<+,->.

The fifth supply sections 513 and 514 included in the third data transmission circuit 470 may supply the power supply voltage VDD and the ground voltage VSS to the fifth input section 511 and the fifth sensing and amplifying section 512 in response to the first read clock RCLK1.

The fifth output section 515 included in the third data transmission circuit 470 may output the third output data ODATA3 to the second data line DND12 among the first lines in response to the third intermediate data pair MDATA3<+,->.

The sixth input section 516 included in the fourth data transmission circuit 480 may change a voltage level pair of a sixth input node pair IND6<+,-> in response to the fourth read data pair RDATA4<+,-> applied to the internal differential data input node pair DND4<+,->.

The sixth sensing and amplifying section 517 included in the fourth data transmission circuit 480 may sense and amplify a change in the voltage level pair of the sixth input node pair IND6<+,->, and output a fourth intermediate data pair MDATA4<+,->.

The sixth supply sections 518 and 519 included in the fourth data transmission circuit 480 may supply the power supply voltage VDD and the ground voltage VSS to the sixth input section 516 and the sixth sensing and amplifying section 517 in response to the second read clock RCLK2.

The sixth output section 520 included in the fourth data transmission circuit 480 may output the fourth output data ODATA4 to the second data line DND22 among the second lines in response to the fourth intermediate data pair MDATA4<+,->.

On the other hand, FIG. 6A illustrating the first clock transmission circuit 430 or the second clock transmission circuit 450 is a diagram for describing a case where the power supply voltage VDD and the ground voltage VSS are applied respectively to the positive and negative input nodes <+,-> of the internal differential data input node pair DNDC{1 or 2}<+,->. In contrast, FIG. 6B illustrating the first clock transmission circuit 430 or the second clock transmission circuit 450 is a diagram for describing a case where the power supply voltage VDD and the ground voltage VSS are applied respectively to the negative and positive nodes <-,+> of the internal differential data input node pair DNDC{1 or 2}<+,->. Accordingly, reference numerals of parts with no difference in FIG. 6A and FIG. 6B may be identical to each other.

Referring to in FIG. 6A and FIG. 6B together, the first clock transmission circuit 430 may include a second input section 601, a second sensing and amplifying section 602, second supply sections 603 and 604, and a second output section 605.

The second clock transmission circuit 450 may include a fourth input section 606, a fourth sensing and amplifying section 607, fourth supply sections 608 and 609, and a fourth output section 610.

The second input section 601 included in the first clock transmission circuit 430 may change a voltage level pair of a second input node pair IND2<+,-> in response to the power supply voltage VDD and the ground voltage VSS applied to the internal differential data input node pair DNDC1<+,->. Accordingly, in FIG. 6A in which the power supply voltage VDD and the ground voltage VSS are applied respectively to the positive and negative input nodes <+,-> of the internal differential data input node pair DNDC1<+,->, the power supply voltage VDD may be applied to the positive input node <+> of the internal differential data input node pair DNDC1<+,-> and the ground voltage VSS may be applied to the negative input node <-> thereof. In contrast, in FIG. 6B in which the power supply voltage VDD and the ground voltage VSS are applied respectively to the negative and positive nodes <-,+> of the internal differential data input node pair DNDC1<+,->, the ground voltage VSS may be applied to the positive input node <+> of the internal differential data input node pair DNDC1<+,-> and the power supply voltage VDD may be applied to the negative input node <-> thereof.

The second sensing and amplifying section 602 included in the first clock transmission circuit 430 may sense and amplify a change in the voltage level pair of the second input node pair IND2<+,->, and output a first intermediate clock pair MCLK1<+,->.

The second supply sections 603 and 604 included in the first clock transmission circuit 430 may supply the power supply voltage VDD and the ground voltage VSS to the second input section 601 and the second sensing and amplifying section 602 in response to the first read clock RCLK1.

The second output section 605 included in the first clock transmission circuit 430 may output the third read clock RCLK3 to the clock line OND1C among the first lines in response to at least one clock within the first intermediate clock pair MCLK1<+,->.

The fourth input section 606 included in the second clock transmission circuit 450 may change a voltage level pair of a fourth input node pair IND4<+,-> in response to the power supply voltage VDD and the ground voltage VSS applied to the internal differential data input node pair DNDC2<+,->. Accordingly, in FIG. 6A in which the power supply voltage VDD and the ground voltage VSS are applied respectively to the positive and negative input nodes <+,-> of the internal differential data input node pair DNDC2<+,->, the power supply voltage VDD may be applied to the positive input node <+> of the internal differential data input node pair DNDC2<+,−> and the ground voltage VSS may be applied to the negative input node <−> thereof. In contrast, in FIG. 6B in which the power supply voltage VDD and the ground voltage VSS are applied respectively to the negative and positive nodes <−,+> of the internal differential data input node pair DNDC2<+,−>, the ground voltage VSS may be applied to the positive input node <+> of the internal differential data input node pair DNDC2<+,−> and the power supply voltage VDD may be applied to the negative input node <−> thereof.

The fourth sensing and amplifying section 607 included in the second clock transmission circuit 450 may sense and amplify a change in the voltage level pair of the fourth input node pair IND4<+,−>, and output a second intermediate clock pair MCLK2<+,−>.

The fourth supply sections 608 and 609 included in the second clock transmission circuit 450 may supply the power supply voltage VDD and the ground voltage VSS to the fourth input section 606 and the fourth sensing and amplifying section 607 in response to the second read clock RCLK2.

The fourth output section 610 included in the second clock transmission circuit 450 may output the fourth read clock RCLK4 to the clock line OND2C among the second lines in response to at least one clock within the second intermediate clock pair MCLK2<+,−>.

When comparing the detailed circuit of FIG. 2 corresponding to the first data transmission circuit 110 and the second data transmission circuit 120 among the components of the signal transmission circuit according to the first embodiment of the present disclosure with the detailed circuit of FIG. 5 corresponding to the first to fourth data transmission circuits 420, 440, 470, and 480 among the components of the memory device 150 according to the second embodiment of the present disclosure, it can be seen that the connection relationships among all elements included therein, that is, the connection relationships among the NMOS transistors, the PMOS transistors, and the inverters are the same. It can be seen that the difference lies in what an inputted signal is and an outputted signal is, that is, whether the inputted signal is the first input data pair IDATA1<+,−>, the second input data pair IDATA2<+,−>, the first operation clock ICLK1, the first to fourth read data pair RDATA{1:4}<+,−>, or the first and second read clocks RCLK{1:2}, and whether the outputted signal is the first output data ODATA1, the second output data ODATA2, the second operation clock ICLK2, the first to fourth output data ODATA{1:4}, or the third and fourth read clocks RCLK{3:4}. Accordingly, since operations corresponding to the first to fourth data transmission circuits 420, 440, 470, 480 among the components of the memory device 150 according to the second embodiment of the present disclosure may refer to operations corresponding to the first data transmission circuit 110 and the second data transmission circuit 120 among the components of the signal transmission circuit according to the first embodiment of the present disclosure, a detailed description thereof is omitted.

When comparing the detailed circuit of the first data transmission circuit 420 or the second data transmission circuit 440 illustrated in FIG. 5 with the detailed circuit of the first clock transmission circuit 430 or the second clock transmission circuit 450 illustrated in FIG. 6A or FIG. 6B, it can be seen that the connection relationships among all elements, that is, the connection relationships among the NMOS transistors, the PMOS transistors, and the inverters are the same. It can be seen that the difference lies in what an inputted signal is and an outputted signal is, that is, whether the inputted signal is the first read data pair RDATA1<+,−>, the second read data pair RDATA2<+,−>, the power supply voltage VDD, or the ground voltage VSS, and whether the outputted signal is the first output data ODATA1, the second operation clock ICLK2, the third read clock RCLK3, or the fourth read clock RCLK4. In this way, since the first data transmission circuit 420 and the second data transmission circuit 440 are modeled respectively on the first clock transmission circuit 430 or the second clock transmission circuit 450, an influence due to PVT variations may be identically applied to the first clock transmission circuit 430 and the first data transmission circuit 420, or the second clock transmission circuit 450 and the second data transmission circuit 440. Of course, as described above with reference to FIG. 4, an influence due to PVT variations identically applied to the first clock transmission circuit 430 and the first data transmission circuit 420 may be different from an influence due to PVT variations identically applied to the second clock transmission circuit 450 and the second data transmission circuit 440. Although not directly illustrated in the drawings, in the first data transmission circuit 420 or the second data transmission circuit 440 illustrated in FIG. 5 and the first clock transmission circuit 430 or the second clock transmission circuit 450 illustrated in FIG. 6A or FIG. 6B, all elements corresponding to each other may have the same size.

THIRD EMBODIMENT

Figure 7:
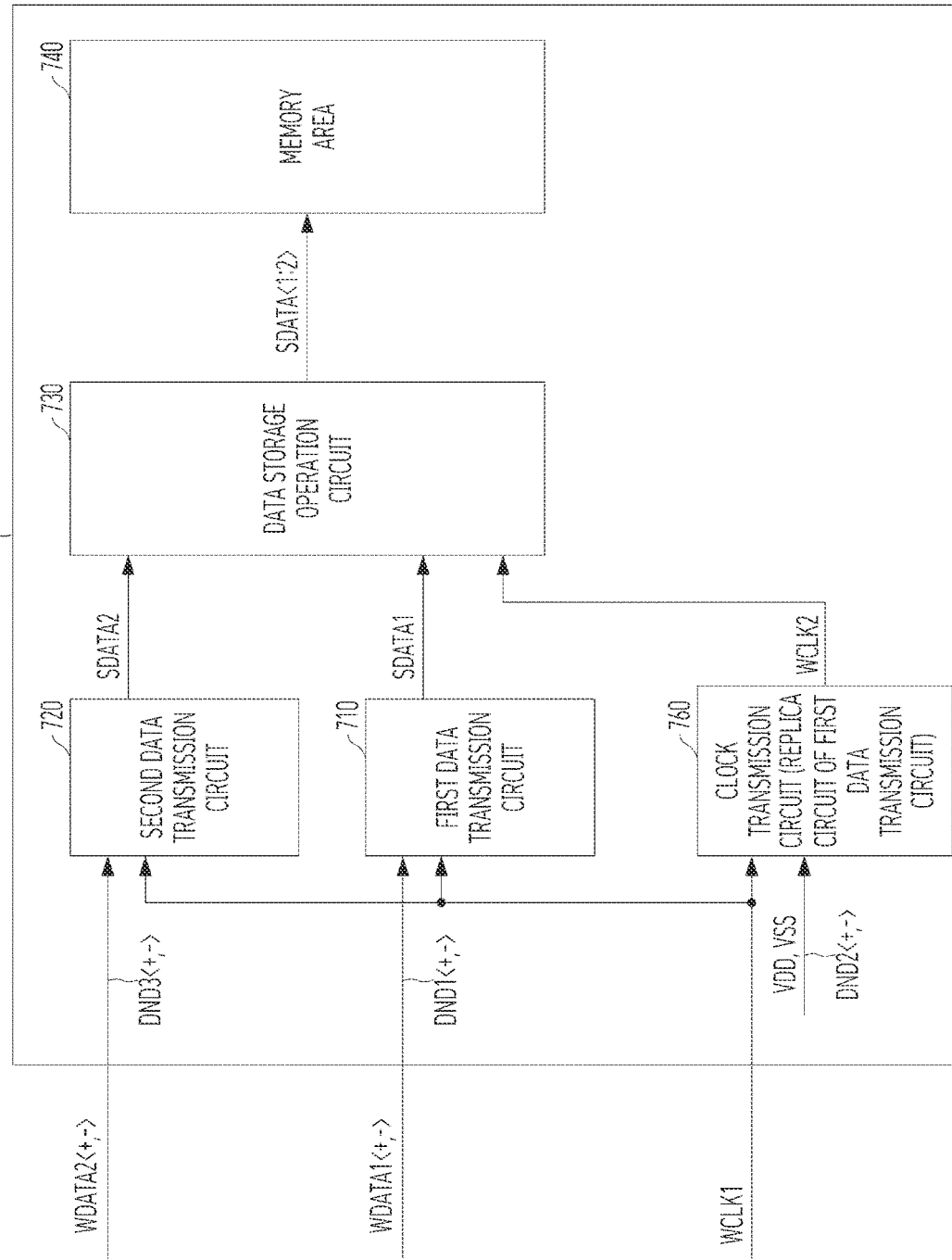
FIG. 7 is a diagram for describing an example of a signal transmission circuit for transmitting a write clock and write data in a memory device according to a third embodiment of the present disclosure.

FIG. 7 is a diagram for describing an example of a signal transmission circuit for transmitting a write clock and write data in a memory device 750 according to a third embodiment of the present disclosure.

Referring to FIG. 7, the memory device 750 may include a first data transmission circuit 710, a second data transmission circuit 720, a clock transmission circuit 760, a data storage operation circuit 730, and a memory area 740.

The memory area 740 may include a plurality of memory cells (not illustrated) for storing data. For example, data inputted from the outside through a program operation may be stored in the memory area 740. Data stored in the memory area 740 may be outputted through a read operation.

The first data transmission circuit 710 may sense and amplify a first write data pair WDATA1<+,−> applied to an internal differential data input node pair DND1<+,−> in response to a first write clock WCLK1, and output the amplified data as first storage data SDATA1.

The first data transmission circuit 710 is modeled on the clock transmission circuit 760, and may output a second write clock WCLK2 generated in response to the first write clock WCLK1 while a power supply voltage VDD and a ground voltage VSS are applied to an internal differential data input node pair DND2<+,−>. In such a case, the fact that the power supply voltage VDD and the ground voltage VSS are applied respectively to the positive and negative input nodes <+,−> of the internal differential data input node pair DND2<+,−> may mean that the power supply voltage VDD is applied to the positive input node <+> of the internal differential data input node pair DND2<+,−> and the ground voltage VSS is applied to the negative input node <−> thereof. In contrast, the fact that the power supply voltage VDD and the ground voltage VSS are applied respectively to the negative and positive nodes <−,+> of the internal differential data input node pair DND2<+,−> may mean that the ground voltage VSS is applied to the positive input node <+> of the internal differential data input node pair DND2<+,−> and the power supply voltage VDD is applied to the negative input node <−> thereof.

The data storage operation circuit 730 may store the first storage data SDATA1 synchronized with a second write clock WCLK2 in the memory area 740.

The fact that the first data transmission circuit 710 is modeled on the clock transmission circuit 760 may mean that the circuit configuration included in the first data transmission circuit 710 has been almost identically replicated and applied to the internal circuit configuration of the clock transmission circuit 760.

In this way, since the first data transmission circuit 710 is modeled on the clock transmission circuit 760, an influence due to PVT (process, voltage, temperature) variations may be identically applied to the clock transmission circuit 760 and the first data transmission circuit 710. For example, the amount of delay, which varies by the PVT variations in the process in which the first write data pair WDATA1<+,−> is inputted to the first data transmission circuit 710 in response to the first write clock WCLK1 and then is outputted as the first storage data SDATA1, may be identical to the amount of delay varying by the PVT variations in the process in which the first write clock WCLK1 is outputted from the clock transmission circuit 760 as the second write clock WCLK2. Accordingly, it is possible to maximally secure a margin window meaning a range in which the value of the first storage data SDATA1 may be accurately recognized based on the toggling of the second write clock WCLK2. That is, when the data storage operation circuit 730 synchronizes the first storage data SDATA1 with the second write clock WCLK2 in order to store the first storage data SDATA1 in the memory area 740, the probability that the value of the first storage data SDATA1 is accurately recognized may be greatly increased.

The second data transmission circuit 720 may sense and amplify a second write data pair WDATA2<+,−> applied to an internal differential data input node pair DND3<+,−> in response to the first write clock WCLK1, and output the amplified data as second storage data SDATA2.

The data storage operation circuit 730 may store the second storage data SDATA2 synchronized with the second write clock WCLK2 in the memory area 740.

In such a case, the time point when the first write data pair WDATA1<+,−> is applied to the first data transmission circuit 710 may be identical to the time point when the second write data pair WDATA2<+,−> is applied to the second data transmission circuit 720. That is, the first write data pair WDATA1<+,−> and the second write data pair WDATA2<+,−> may be applied in parallel to the first data transmission circuit 710 and the second data transmission circuit 720.

In this way, the first data transmission circuit 710 and the second data transmission circuit 720 may sense and amplify different data inputted in parallel at the same time point and output the amplified data in parallel. That is, the first data transmission circuit 710 and the second data transmission circuit 720 may receive, sense, and amplify the first write data pair WDATA1<+,−> and the second write data pair WDATA2<+,−> inputted in parallel at the same time point, and output the first storage data SDATA1 and the second storage data SDATA2 in parallel.

Accordingly, an influence due to PVT variations may be identically applied to the first data transmission circuit 710 and the second data transmission circuit 720. For example, the amount of delay, which varies by the PVT variations in the process in which the first write data pair WDATA1<+,−> is inputted to the first data transmission circuit 710 in response to the first write clock WCLK1 and then is outputted as the first storage data SDATA1, may be identical to the amount of delay varying by the PVT variations in the process in which the second write data pair WDATA2<+,−> is inputted to the second data transmission circuit 720 in response to the first write clock WCLK1 and then is outputted as the second storage data SDATA2.

As described above, since an influence due to PVT variations may be identically applied to the clock transmission circuit 760 and the first data transmission circuit 710 and may be identically applied to the first data transmission circuit 710 and the second data transmission circuit 720, the influence due to PVT variations may also be identically applied to the clock transmission circuit 760 and the second data transmission circuit 720. Accordingly, it is possible to maximally secure a margin window meaning a range in which the value of the second storage data SDATA2 may be accurately recognized based on the toggling of the second write clock WCLK2. That is, when the data storage operation circuit 730 synchronizes the second storage data SDATA2 with the second write clock WCLK2 in order to store the second storage data SDATA2 in the memory area 740, the probability that the value of the second storage data SDATA2 is accurately recognized may be greatly increased.

FIG. 7 discloses a configuration in which only the first data transmission circuit 710 and the second data transmission circuit 720 are provided to receive two write data WDATA1<+,−> and WDATA2<+,−> and transmit two storage data SDATA1 and SDATA2 and only one clock transmission circuit 760 is provided to transmit one first write clock WCLK1 as one second write clock WCLK2. This is only one example, and in order to transmit more write data as storage data, only one clock transmission circuit may be provided together with a larger number of data transmission circuits to transmit one first write clock as one second write clock. That is, in the memory device according to the third embodiment of the present disclosure, a larger number of data and one clock may be transmitted. For example, it is also possible to perform an operation in which, through sixteen data transmission circuits for transmitting sixteen write data as sixteen storage data and a clock transmission circuit, on which any one of the sixteen data transmission circuits is modeled, a first write clock applied to the respective sixteen data transmission circuits is transmitted as a second write clock.

Figure 8:
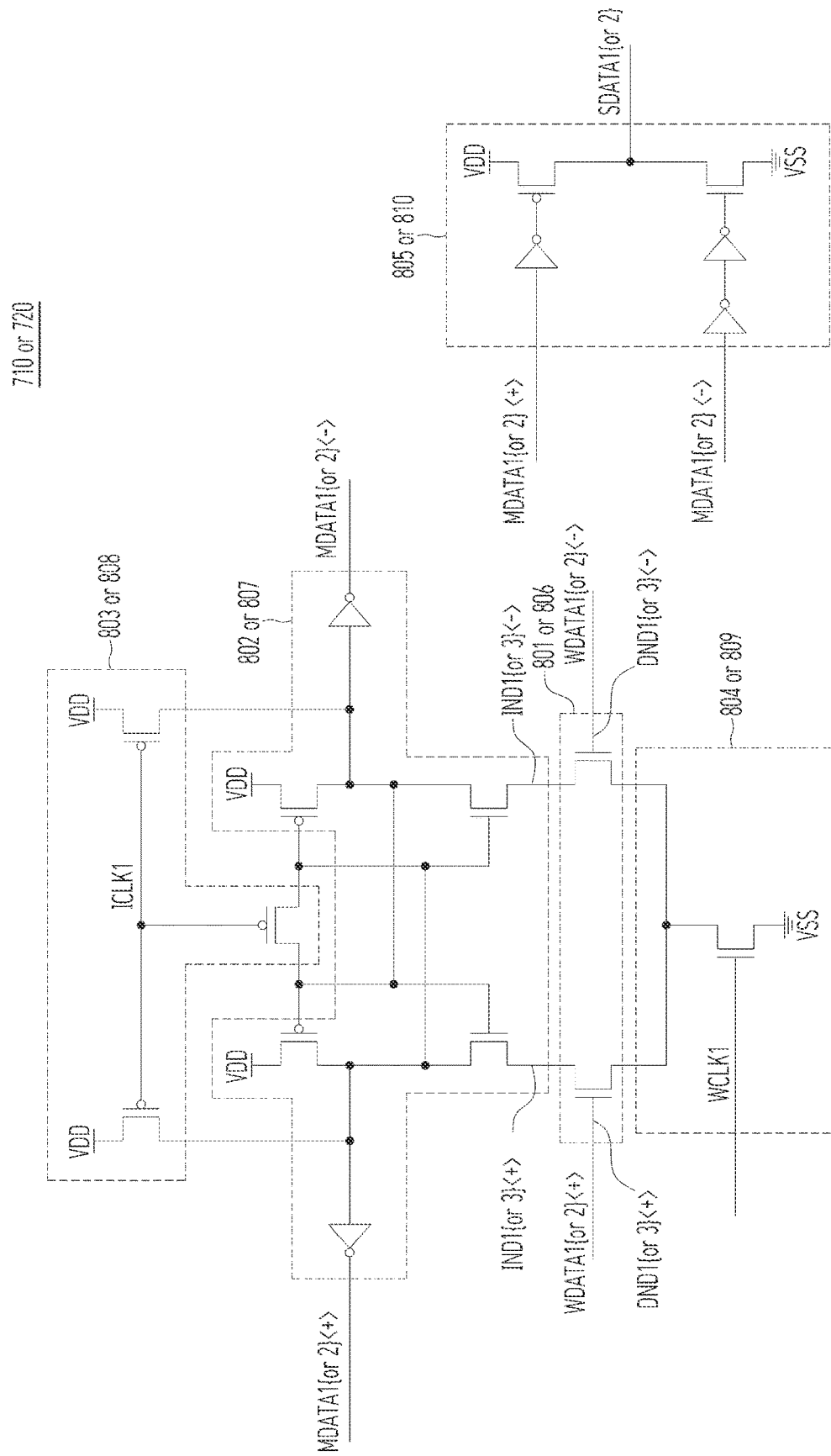
FIG. 8 is a diagram for describing a detailed circuit configuration of first and second data transmission circuits among the components of the memory device illustrated in FIG. 7.

FIG. 8 is a diagram for describing a detailed circuit configuration of each of the first and second data transmission circuits among the components of the signal transmission circuit illustrated in FIG. 7.

Figure 9A:
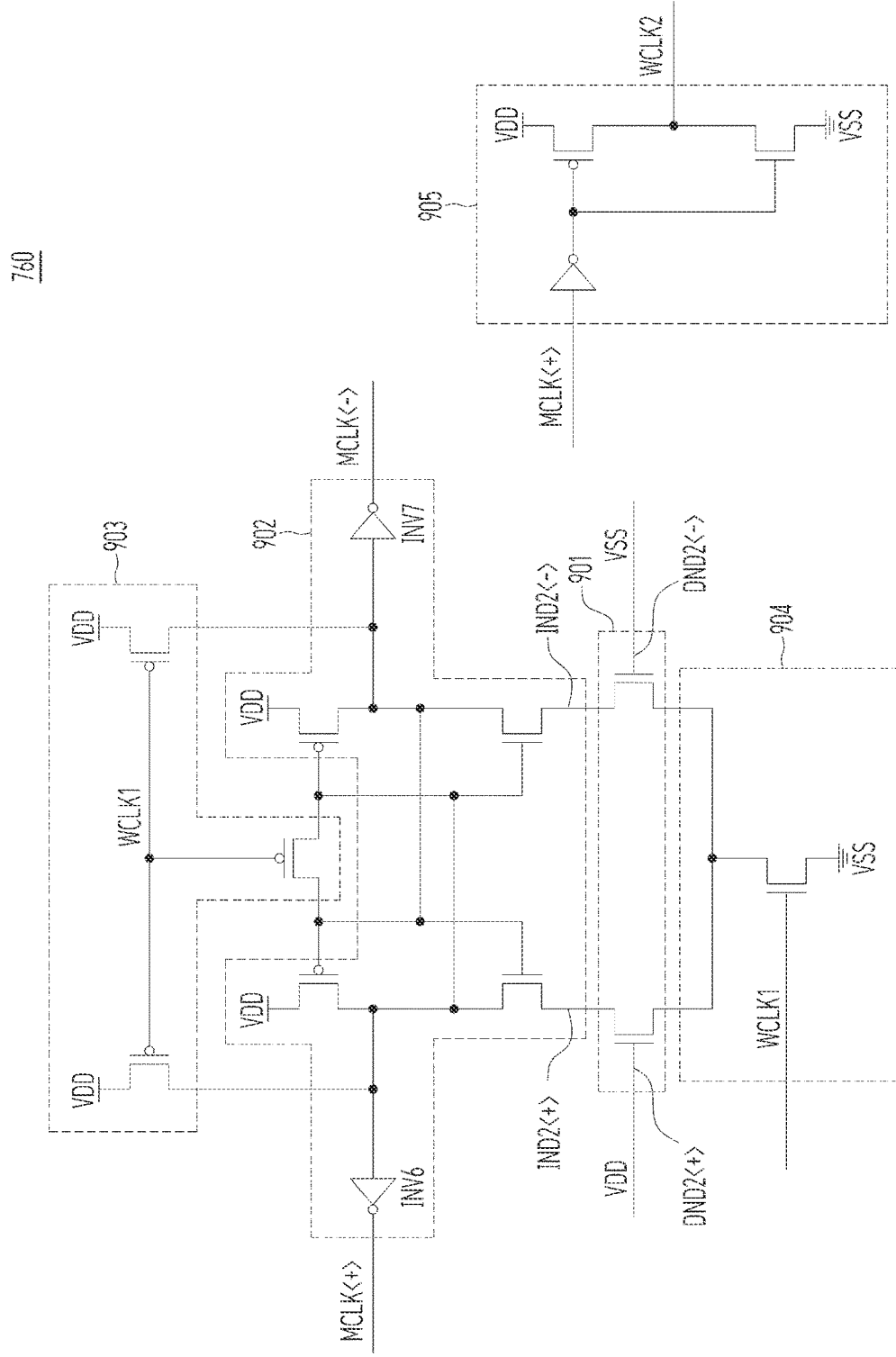
FIG. 9A and FIG. 9B are diagrams for describing a detailed circuit configuration of a clock transmission circuit among the components of the memory device illustrated in FIG. 7.
Figure 9B:
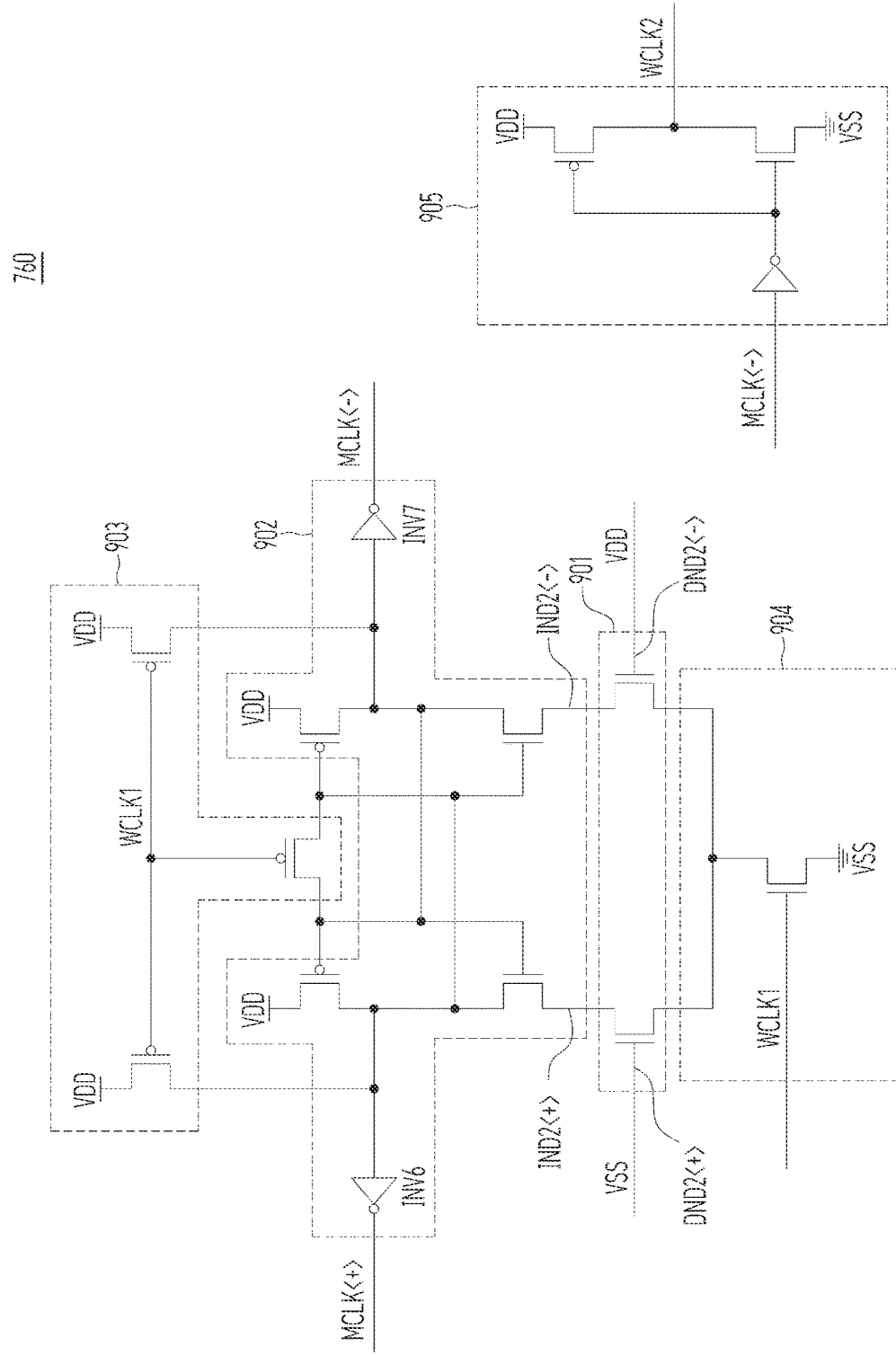

FIG. 9A and FIG. 9B are diagrams for describing a detailed circuit configuration of the clock transmission circuit among the components of the signal transmission circuit illustrated in FIG. 7.

Referring to FIG. 8, the first data transmission circuit 710 may include a first input section 801, a first sensing and amplifying section 802, first supply sections 803 and 804, and a first output section 805.

The second data transmission circuit 720 may include a third input section 806, a third sensing and amplifying section 807, third supply sections 808 and 809, and a third output section 810.

The first input section 801 included in the first data transmission circuit 710 may change a voltage level pair of a first input node pair IND1<+,−> in response to the first write data pair WDATA1<+,−> applied to the internal differential data input node pair DND1<+,−>.

The first sensing and amplifying section 802 included in the first data transmission circuit 710 may sense and amplify a change in the voltage level pair of the first input node pair IND1<+,->, and output a first intermediate data pair MDATA1<+,->.

The first supply sections 803 and 804 included in the first data transmission circuit 710 may supply the power supply voltage VDD and the ground voltage VSS to the first input section 801 and the first sensing and amplifying section 802 in response to the first write clock WCLK1.

The first output section 805 included in the first data transmission circuit 710 may output the first storage data SDATA1 generated in response to the first intermediate data pair MDATA1<+,-> to the data storage operation circuit 730.

The third input section 806 included in the second data transmission circuit 720 may change a voltage level pair of a third input node pair IND3<+,-> in response to the second write data pair WDATA2<+,-> applied to the internal differential data input node pair DND3<+,->.

The third sensing and amplifying section 807 included in the second data transmission circuit 720 may sense and amplify a change in the voltage level pair of the third input node pair IND3<+,->, and output a second intermediate data pair MDATA2<+,->.

The third supply sections 808 and 809 included in the second data transmission circuit 720 may supply the power supply voltage VDD and the ground voltage VSS to the third input section 806 and the third sensing and amplifying section 807 in response to the first write clock WCLK1.

The third output section 810 included in the second data transmission circuit 720 may output the second storage data SDATA2 generated in response to the second intermediate data pair MDATA2<+,-> to the data storage operation circuit 730.

On the other hand, FIG. 9A illustrating the clock transmission circuit 760 is a diagram for describing a case where the power supply voltage VDD and the ground voltage VSS are applied respectively to the positive and negative input nodes <+,-> of the internal differential data input node pair DND2<+,->. In contrast, FIG. 9B illustrating the clock transmission circuit 760 is a diagram for describing a case where the power supply voltage VDD and the ground voltage VSS are applied respectively to the negative and positive nodes <-,+> of the internal differential data input node pair DND2<+,->. Accordingly, reference numerals of parts with no difference in FIG. 9A and FIG. 9B may be identical to each other.

Referring to in FIG. 9A and FIG. 9B together, the clock transmission circuit 760 may include a second input section 901, a second sensing and amplifying section 902, second supply sections 903 and 904, and a second output section 905.

The second input section 901 may change a voltage level pair of a second input node pair IND2<+,-> in response to the power supply voltage VDD and the ground voltage VSS applied to the internal differential data input node pair DND2<+,->. Accordingly, in FIG. 9A in which the power supply voltage VDD and the ground voltage VSS are applied respectively to the positive and negative input nodes <+,-> of the internal differential data input node pair DND2<+,->, the power supply voltage VDD may be applied to the positive input node <+> of the internal differential data input node pair DND2<+,-> and the ground voltage VSS may be applied to the negative input node <-> thereof. In contrast, in FIG. 9B in which the power supply voltage VDD and the ground voltage VSS are applied respectively to the negative and positive nodes <-,+> of the internal differential data input node pair DND2<+,->, the ground voltage VSS may be applied to the positive input node <+> of the internal differential data input node pair DND2<+,-> and the power supply voltage VDD may be applied to the negative input node <-> thereof.

The second sensing and amplifying section 902 may sense and amplify a change in the voltage level pair of the second input node pair IND2<+,->, and output an intermediate clock pair MCLK<+,->.

The second supply sections 903 and 904 may supply the power supply voltage VDD and the ground voltage VSS to the second input section 901 and the second sensing and amplifying section 902 in response to the first write clock WCLK1 applied to a second clock input node CDN2.

The second output section 905 may output the second write clock WCLK2 generated in response to one clock within the intermediate clock pair MCLK<+,-> to the data storage operation circuit 730.

When comparing the detailed circuit of FIG. 2 corresponding to the first data transmission circuit 110 and the second data transmission circuit 120 among the components of the signal transmission circuit according to the first embodiment of the present disclosure with the detailed circuit of FIG. 8 corresponding to the first data transmission circuit 710 and the second data transmission circuit 720 among the components of the memory device 150 according to the third embodiment of the present disclosure, it can be seen that the connection relationships among all elements included therein, that is, the connection relationships among the NMOS transistors, the PMOS transistors, and the inverters are the same. It can be seen that the difference lies in what an inputted signal is and an outputted signal is, that is, whether the inputted signal is the first input data pair IDATA1<+,->, the second input data pair IDATA2<+,->, the first operation clock ICLK1, the first write data pair WDATA1<+,->, the second write data pair WDATA2<+,->, or the first write clock WCLK1, and whether the outputted signal is the first output data ODATA1, the second output data ODATA2, the second operation clock ICLK2, the first storage data SDATA1, the second storage data SDATA2, or the second write clock WCLK2. Accordingly, since operations corresponding to the first and second data transmission circuits 710 and 720 among the components of the memory device 150 according to the third embodiment of the present disclosure may refer to operations corresponding to the first and second data transmission circuits 110 and 120 among the components of the signal transmission circuit according to the first embodiment of the present disclosure, a detailed description thereof is omitted.

When comparing the detailed circuit of the first data transmission circuit 710 illustrated in FIG. 8 with the detailed circuit of the clock transmission circuit 760 illustrated in FIG. 9A or FIG. 9B, it can be seen that the connection relationships among all elements, that is, the connection relationships among the NMOS transistors, the PMOS transistors, and the inverters are the same. It can be seen that the difference lies in what an inputted signal is and an outputted signal is, that is, whether the inputted signal is the first write data pair WDATA1<+,->, the power supply voltage VDD, or the ground voltage VSS, and whether the outputted signal is the first storage data SDATA1 or the second write clock WCLK2. In this way, since the first data transmission circuit 710 is modeled on the clock transmission circuit 760, an influence due to PVT variations may be identically applied to the clock transmission circuit 760 and the first data transmission circuit 710. Although not directly illustrated in the drawings, in the first data transmission circuit 710 illustrated in FIG. 8 and the clock transmission circuit 760 illustrated in FIG. 9A or FIG. 9B, all elements corresponding to each other may have the same size.

The present disclosure described above is not limited by the aforementioned embodiments and the accompanying drawings, and it will be apparent to those skilled in the art to which the present disclosure pertains that various replacements, modifications, and changes can be made without departing from the technical spirit of the present disclosure and the following claims. Furthermore, the embodiments may be combined to form additional embodiments.

For example, the position and the type of a logic gate and a transistor illustrated in the aforementioned embodiments should be differentially implemented according to the polarity of an inputted signal.

What is claimed is:

1. A signal transmission circuit comprising:
   a first data transmission circuit configured to output, through a first data output node thereof and in response to a first operation clock applied to a first clock input node thereof, first output data obtained by sensing and amplifying a first input data pair applied to a first differential input node pair thereof;
   a clock transmission circuit configured to output through a second data output node thereof, a second operation clock generated in response to the first operation clock applied to a second clock input node thereof while a power supply voltage and a ground voltage are applied to a second differential input node pair thereof; and
   a first data output circuit configured to output the first output data in synchronization with the second operation clock,
   wherein the first data transmission circuit is modeled on the clock transmission circuit.

2. The signal transmission circuit of claim 1, wherein the first data transmission circuit comprises:
   a first input section configured to change a voltage level pair of a first input node pair thereof in response to the first input data pair;
   a first sensing and amplifying section configured to sense and amplify a change in the voltage level pair of the first input node pair to output a first intermediate data pair;
   a first supply section configured to supply the power supply voltage and the ground voltage to the first input section and the first sensing and amplifying section in response to the first operation clock; and
   a first output section configured to output the first output data through the first data output node in response to the first intermediate data pair.

3. The signal transmission circuit of claim 2, wherein the clock transmission circuit comprises:
   a second input section configured to change a voltage level pair of a second input node pair thereof in response to the power supply voltage and the ground voltage;
   a second sensing and amplifying section configured to sense and amplify a change in the voltage level pair of the second input node pair to output an intermediate clock pair;
   a second supply section configured to supply the power supply voltage and the ground voltage to the second input section and the second sensing and amplifying section in response to the first operation clock; and
   a second output section configured to output the second operation clock through the second data output node in response to a clock within the intermediate clock pair.

4. The signal transmission circuit of claim 2, further comprising:
   a second data transmission circuit configured to output, through a third data output node thereof and in response to the first operation clock applied to a third clock input node thereof, second output data obtained by sensing and amplifying a second input data pair applied to a third differential input node pair thereof; and
   a second data output circuit configured to output the second output data in synchronization with the second operation clock,
   wherein a time point when the first input data pair is applied to the first differential input node pair is identical to a time point when the second input data pair is applied to the third differential input node pair.

5. The signal transmission circuit of claim 4, wherein the second data transmission circuit comprises:
   a third input section configured to change a voltage level pair of a third input node pair thereof in response to the second input data pair;
   a third sensing and amplifying section configured to sense and amplify a change in the voltage level pair of the third input node pair to output a second intermediate data pair;
   a third supply section configured to supply the power supply voltage and the ground voltage to the third input section and the third sensing and amplifying section in response to the first operation clock; and
   a third output section configured to output the second output data through the third data output node in response to the second intermediate data pair.

6. A memory device comprising:
   a first memory area configured to internally read a first read data pair in response to a first read clock;
   a second memory area configured to internally read a second read data pair in response to a second read clock;
   a first data transmission circuit configured to output, through a first data line among first lines and in response to the first read clock, first output data obtained by sensing and amplifying the first read data pair applied to a first internal differential data input node pair thereof;
   a first clock transmission circuit configured to output through a clock line among the first lines, a third read clock generated in response to the first read clock while a power supply voltage and a ground voltage are applied to a second internal differential data input node pair;
   a second data transmission circuit configured to output, through a first data line among second lines and in response to the second read clock, second output data obtained by sensing and amplifying the second read data pair applied to a third internal differential data input node pair;
   a second clock transmission circuit configured to output through a clock line among the second lines, a fourth read clock generated in response to the second read clock while the power supply voltage and the ground voltage are applied to a fourth internal differential data input node pair; and
   a data output circuit connected to the first lines, the second lines, and shared lines, and configured to output through a first data line among the shared lines, one of the first output data in synchronization with the third read clock and the second output data in synchronization with the fourth read clock, wherein the first data transmission circuit is modeled on the first clock transmission circuit, and wherein the second data transmission circuit is modeled on the second clock transmission circuit.

7. The memory device of claim 6, wherein the first data transmission circuit comprises:
 a first input section configured to change a voltage level pair of a first input node pair thereof in response to the first read data pair;
 a first sensing and amplifying section configured to sense and amplify a change in the voltage level pair of the first input node pair to output a first intermediate data pair;
 a first supply section configured to supply the power supply voltage and the ground voltage to the first input section and the first sensing and amplifying section in response to the first read clock; and
 a first output section configured to output the first output data through the first data line among the first lines in response to the first intermediate data pair.

8. The memory device of claim 7, wherein the first clock transmission circuit comprises:
 a second input section configured to change a voltage level pair of a second input node pair thereof in response to the power supply voltage and the ground voltage;
 a second sensing and amplifying section configured to sense and amplify a change in the voltage level pair of the second input node pair to output a first intermediate clock pair;
 a second supply section configured to supply the power supply voltage and the ground voltage to the second input section and the second sensing and amplifying section in response to the first read clock; and
 a second output section configured to output the third read clock to a clock line among the first lines in response to a clock within the first intermediate clock pair.

9. The memory device of claim 7, wherein the second data transmission circuit comprises:
 a third input section configured to change a voltage level pair of a third input node pair thereof in response to the second read data pair;
 a third sensing and amplifying section configured to sense and amplify a change in the voltage level pair of the third input node pair to output a second intermediate data pair;
 a third supply section configured to supply the power supply voltage and the ground voltage to the third input section and the third sensing and amplifying section in response to the second read clock; and
 a third output section configured to output the second output data through a first data line among the second lines in response to the second intermediate data pair.

10. The memory device of claim 9, wherein the second clock transmission circuit comprises:
 a fourth input section configured to change a voltage level pair of a fourth input node pair thereof in response to the power supply voltage and the ground voltage;
 a fourth sensing and amplifying section configured to sense and amplify a change in the voltage level pair of the fourth input node pair to output a second intermediate clock pair;
 a fourth supply section configured to supply the power supply voltage and the ground voltage to the fourth input section and the fourth sensing and amplifying section in response to the second read clock; and
 a fourth output section configured to output the fourth read clock through the clock line among the second lines in response to a clock within the second intermediate clock pair.

11. The memory device of claim 7,
wherein the first memory area is further configured to internally read, at the same time point when the first read data pair is read, a third read data pair in response to the first read clock,
wherein the memory device further comprises a third data transmission circuit configured to output through a second data line among the first lines and in response to the first read clock, third output data obtained by sensing and amplifying the third read data pair applied to a fifth internal differential data input node pair, and
wherein the data output circuit is further configured to output through a second data line among the shared lines, the third output data in synchronization with the third read clock at the same time point when the first output data is outputted through the first data line among the shared lines.

12. The memory device of claim 11, wherein the third data transmission circuit comprises:
 a fifth input section configured to change a voltage level pair of a fifth input node pair thereof in response to the third read data pair;
 a fifth sensing and amplifying section configured to sense and amplify a change in the voltage level pair of the fifth input node pair to output a third intermediate data pair;
 a fifth supply section configured to supply the power supply voltage and the ground voltage to the fifth input section and the fifth sensing and amplifying section in response to the first read clock; and
 a fifth output section configured to output the third output data through a second data line among the first lines in response to the third intermediate data pair.

13. The memory device of claim 9,
wherein the second memory area is further configured to internally read, at the same time point when the second read data pair is read, a fourth read data pair in response to the second read clock,
wherein the memory device further comprises a fourth data transmission circuit configured to output, through a second data line among the second lines and in response to the second read clock, fourth output data obtained by sensing and amplifying the fourth read data pair applied to a sixth internal differential data input node pair, and
wherein the data output circuit is further configured to output through a second data line among the shared lines, the fourth output data in synchronization with the fourth read clock at the same time point when the second output data is outputted through a first data line among the shared lines.

14. The memory device of claim 13, wherein the fourth data transmission circuit comprises:
 a sixth input section configured to change a voltage level pair of a sixth input node pair thereof in response to the fourth read data pair;
 a sixth sensing and amplifying section configured to sense and amplify a change in the voltage level pair of the sixth input node pair to output a fourth intermediate data pair;

a sixth supply section configured to supply the power supply voltage and the ground voltage to the sixth input section and the sixth sensing and amplifying section in response to the second read clock; and a sixth output section configured to output the fourth output data through a second data line among the second lines in response to the fourth intermediate data pair.

15. A memory device comprising:

a first data transmission circuit configured to sense and amplify a first write data pair applied to a first internal differential data input node pair in response to a first write clock to output the amplified data as first storage data;

a clock transmission circuit configured to output a second write clock generated in response to the first write clock while a power supply voltage and a ground voltage are applied to a second internal differential data input node pair; and a data storage operation circuit configured to store, in an internal memory area, the first storage data in synchronization with the second write clock, wherein the first data transmission circuit is modeled on the clock transmission circuit.

16. The memory device of claim 15, wherein the first data transmission circuit comprises:

a first input section configured to change a voltage level pair of a first input node pair thereof in response to the first write data pair;

a first sensing and amplifying section configured to sense and amplify a change in the voltage level pair of the first input node pair to output a first intermediate data pair;

a first supply section configured to supply the power supply voltage and the ground voltage to the first input section and the first sensing and amplifying section in response to the first write clock; and a first output section configured to output, to the data storage operation circuit, the first storage data generated in response to the first intermediate data pair.

17. The memory device of claim 16, wherein the clock transmission circuit comprises:

a second input section configured to change a voltage level pair of a second input node pair thereof in response to the power supply voltage and the ground voltage;

a second sensing and amplifying section configured to sense and amplify a change in the voltage level pair of the second input node pair to output an intermediate clock pair;

a second supply section configured to supply the power supply voltage and the ground voltage to the second input section and the second sensing and amplifying section in response to the first write clock; and a second output section configured to output, to the data storage operation circuit, the second write clock generated in response to a clock within the intermediate clock pair.

18. The memory device of claim 16, further comprising a second data transmission circuit configured to sense and amplify a second write data pair applied to a third internal differential data input node pair in response to the first write clock to output the amplified data as second storage data, wherein the data storage operation circuit is further configured to store, in the internal memory area, the second storage data in synchronization with the second write clock, and wherein a time point when the first write data pair is applied to the first differential input node pair is identical to a time point when the second write data pair is applied to the third internal differential data input node pair.

19. The memory device of claim 18, wherein the second data transmission circuit comprises:

a third input section configured to change a voltage level pair of a third input node pair thereof in response to the second write data pair;

a third sensing and amplifying section configured to sense and amplify a change in the voltage level pair of the third input node pair to output a second intermediate data pair;

a third supply section configured to supply the power supply voltage and the ground voltage to the third input section and the third sensing and amplifying section in response to the first write clock; and a third output section configured to output, to the data storage operation circuit, the second storage data generated in response to the second intermediate data pair.

* * * * *